(12) United States Patent
Katz et al.

(10) Patent No.: US 7,993,959 B2
(45) Date of Patent: Aug. 9, 2011

(54) METHODS FOR PRODUCING MULTIPLE DISTINCT TRANSISTORS FROM A SINGLE SEMICONDUCTOR

(75) Inventors: Howard E. Katz, Baltimore, MD (US); Cheng Huang, Baltimore, MD (US)

(73) Assignee: The Johns Hopkins University, Baltimore, MD (US)

( * ) Notice: Subject to any disclaimer, the term of this patent is extended or adjusted under 35 U.S.C. 154(b) by 354 days.

(21) Appl. No.: 11/607,459

(22) Filed: Dec. 1, 2006

(65) Prior Publication Data
US 2008/0157128 A1    Jul. 3, 2008

Related U.S. Application Data

(60) Provisional application No. 60/844,597, filed on Sep. 14, 2006.

(51) Int. Cl.
*H01L 51/40* (2006.01)
(52) U.S. Cl. .......... 438/99; 438/157; 257/E21.414
(58) Field of Classification Search .......... 257/215, 257/E29.213, E29.214, E21.003, E21.456; 438/99, 144; *H01L 51/05, 27/28*
See application file for complete search history.

(56) References Cited

U.S. PATENT DOCUMENTS

| | | | | |
|---|---|---|---|---|
| 6,249,117 | B1 * | 6/2001 | Koelsch et al. | 324/158.1 |
| 6,870,180 | B2 * | 3/2005 | Dodabalapur et al. | 257/40 |
| 2006/0198216 | A1 * | 9/2006 | Park et al. | 365/200 |

OTHER PUBLICATIONS

Giacometti et al., Corona Charging of Polymers, Oct. 1992, IEEE Transactions on Electrical Insulation, vol. 27, 924-938.*
Katz et al., Organic field-effect transistors with polarizable gate insulators, Feb. 2002, Journal of Applied Physics, vol. 91, 1572-1576.*
Chung-Jun Song, Effects of Hydrophobic Treatment on the Performance of Pentacene TFT, 2002, KIEE International Transactions on EA, 136-138.*
Benson et al., Organic CMOS-Technology by Interface Treatment, Aug. 2006, Proces. of SPIE, vol. 6336, 63360S1- 63360S10.*
Benson et al., Organic CMOS-Technology by Interface Treatment, Aug. 13, 2006, Organic Field-Effect Transistors V, Proc. of SPIE, vol. 6336, pp. 63360S1-63360S10.*
Facchetti, A.; et al.; "Synthesis and Characterization of Diperfluorooctyl-Substituted Phenylene-Thiophene Oligomers as n-Type Semiconductors. Molecular Structure-Film Microstructure-Mobility Relationships, Organic Field-Effect Transistors, and Transistor Nonvolatile Memory Elements"; Chem. Mater. (2004) 16, pp. 4715-4727.
Mushrush, M.; et al.; "Easily Processable Phenylene-Thiophene-Based Organic Field-Effect Transistors and Solution-Fabricated Nonvolatile Transistor Memory Elements"; J. Am. Chem. Soc., (2003) 125, pp. 9414-9423.

* cited by examiner

*Primary Examiner* — Chandra Chaudhari
(74) *Attorney, Agent, or Firm* — Foley Hoag, LLP

(57) ABSTRACT

Provided are methods for producing multiple distinct transistors from a single semiconductor layer, and apparatus incorporating transistors so produced.

34 Claims, 23 Drawing Sheets

METHODS FOR PRODUCING MULTIPLE DISTINCT TRANSISTORS FROM A SINGLE SEMICONDUCTOR

CROSS-REFERENCE TO RELATED APPLICATIONS

This application claims priority to U.S. Provisional Patent Application 60/844,597, filed on Sep. 14, 2006, which is hereby incorporated herein by reference its entirety.

BACKGROUND

Organic field-effect transistors (OFETs) based on organic semiconductor (OSC) thin films show promise as building blocks for low-cost, large-area and flexible electronics for applications such as displays, smart cards, radio-frequency identification tags, and sensors. Most of the OFETs fabricated to date exhibit unipolar conduction with a single carrier type (holes or electrons, p or n respectively). This makes complementary circuit elements, which are more power-efficient and lower-noise than unipolar analogues, challenging to implement because of the need to pattern more than one OSC material. Recent attempts to realize single-component OFET complementary inverters have focused on OSC-metal electrode interface modifications to control the carrier injection. They have been operated in high vacuum or under inert atmosphere either with relatively unstable low work-function metals such as calcium employed as the source and drain electrodes and calcium as chemical dopants of the OSC, or molecules designed to optimize the highest occupied molecular orbital (HOMO) or lowest unoccupied molecular orbital (LUMO) energy levels.

While an inversion layer (mobile charges of the minority carrier type) is often obtained in silicon semiconductor devices using a metal-insulator-semiconductor or metal-oxide-semiconductor structure where the metallic gate is biased to supply the required electric field, organic semiconductor thin films generally do not show inversion operation (intended here as the accumulation of the less probable carrier type based on orbital energy levels) because of the large gate voltage required to bend the bands and fill traps. In most OFETs, numerous traps will occur near the gate dielectric interface or around the OSC grain boundaries. The limitation of charge transport by only one carrier type is generally ascribed to this effective trapping of the other carrier type. The trapping limitation could be lessened by using ultrapure, high-quality materials in single crystal devices and the realization of the intrinsic (not limited by disorder) charge transport on the OSC single-crystal surface.

SUMMARY

Provided are transistors wherein the dielectric layer is charged after its deposition, but before the deposition of the semiconductor and the application of the source and drain, and processes for producing the same. The charging process may be monitored using surface charge measurements on the dielectrics, and correlated with further observations made on the complete devices. Because different regions of the dielectric layer can be charged to different degrees, distinct devices may be positioned on a single substrate, with the same dielectric layer and semiconductor layer in all regions. Thus, pairs of accumulation-mode and depletion-mode transistors may be formed from the same semiconductor and full-swing unipolar inverters may comprise these pairs of transistors with the same channel dimensions.

The transistors so produced may be utilized in an appropriately configured circuit. One or more of the transistors may be integrated into an amplifier, a ring oscillator, a rectifier, a sensor or an array of transistors.

DETAILED DESCRIPTION

Figure 1:
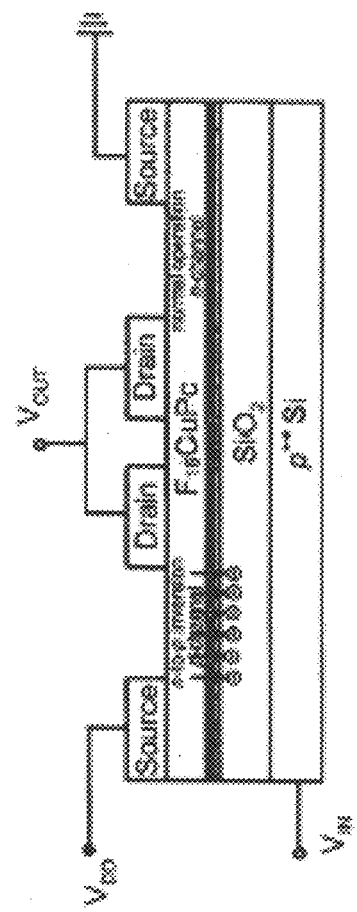
FIG. 1 depicts a schematic of the organic complementary inverter with an n-channel enhancement-mode transistor driver on the normal $SiO_2$ dielectric (with HMDS coating) and a p-channel inversion-mode transistor load on charged region of the dielectric, acting as an electret. For both n and p channels, the channel length L and width W are 50 μm and 2 mm, respectively. Gold and $F_{16}CuPc$ were used as electrode and OSC thin film materials, respectively.

For convenience, before further description of the present invention, certain terms employed in the specification, examples and appended claims are collected here. These definitions should be read in light of the remainder of the disclosure and understood as by a person of ordinary skill in the art. Unless defined otherwise, all technical and scientific terms used herein have the same meaning as commonly understood by a person of ordinary skill in the art.

The articles "a" and "an" are used herein to refer to one or to more than one (i.e., to at least one) of the grammatical object of the article. By way of example, "an element" means one element or more than one element.

The term "depositing" refers to any process that grows, coats, or otherwise transfers a material onto a substrate. Deposition methods include, but are not limited to, physical vapor deposition (PVD), chemical vapor deposition (CVD), electrochemical deposition (ECD), molecular beam epitaxy (MBE) and more recently, atomic layer deposition (ALD) among others.

The term "dielectric layer" refers to a layer comprised of at least one material that is a poor conductor of electricity, but an efficient supporter of an electrostatic field.

The term "electrode" refers to any device that collects or emits electric charge and controls the movement of electrons.

The term "field effect transistor" or "FET" refers to a transistor with a region of semiconductor material with two electrodes called the "source" and the "drain", and an adjoining region of polarizing material between, called the "gate", or control electrode. The voltage between the gate and the semiconductor controls the current flow between source and drain by modulating the density of charge carriers to greater or lesser extent. In the FET, current flows along a semiconductor path called the channel. At one end of the channel, there is the source electrode. At the other end of the channel, there is the drain electrode. The physical extent of the channel is fixed, but its effective electrical extent can be varied by the application of a voltage to the gate. The conductivity of the FET depends, at any given instant in time, on the electrical extent of the channel. A small change in gate voltage can cause a large variation in the current from the source to the drain.

The term "quasipermanent" means nearly nonreversible.

The term "region" as used herein refers to a spatial location in a layer.

The term "semiconductor layer" refers to a layer comprised of at least one solid material whose electrical conductivity can be controlled over a wide range, either permanently or dynamically.

The term "tuning" refers to any process for controlling the output of a transistor, generally by changing the size of the transistor.

Provided are methods of producing transistors which are charged after the deposition of the dielectric layer, but before the deposition of the semiconductor and the application of the source and drain, and processes for producing the same.

In certain embodiments, a method may comprise the acts of: (a) depositing a dielectric layer on a substrate; (b) charging the dielectric layer to create at least two regions in the dielectric layer having different charge levels; (c) depositing a semiconductor layer on the surface of the charged dielectric layer such that all or a part of the deposited semiconductor layer is in contact with all or a part of the deposited dielectric layer; and (d) depositing at least one electrode over at least one of the regions in the dielectric layer.

Regions have different charge levels if the effect of the charged regions on the adjacent semiconductor is equivalent to imposing a specific volt-per-micron of dielectric thickness shift in the effective voltage imparted by the gate electrode. Embodiments intended for different applications will not always produce the same shifts, but most applications will require shifts of at least about a two volt-per-micron shift, preferably at least about a five volt-per-micron shift.

The acts of the method may be performed in any order. For example, the act (b) may be performed before the act (c), or vice versa. Even where the act (b) is performed after act (c), it is the dielectric layer that is charged, not the semiconductor layer. Alternatively, the act (d) may be performed before the act (c).

Furthermore, any of the acts may be repeated one or more times. For example, the act (b) of charging may be repeated at least once.

In certain embodiments, the act (b) may comprise charging the dielectric layer to create at least three regions in the dielectric layer having different charge levels.

In other embodiments, the act (d) comprises depositing at least one electrode in contact with the semiconductor layer over at least one of the regions in the dielectric layer.

In still other embodiments, the act (d) may comprise depositing at least one electrode on the surface of the dielectric layer over at least one of the regions in the dielectric layer, prior to depositing the semiconductor layer on the surface of the charged dielectric layer.

Depositing the semiconductor layer on the surface of the dielectric layer may in certain embodiments, result in conversion between the p-type and n-type character of the semiconductor layer. For example, depositing the semiconductor layer on the surface of the charged dielectric layer may result in an inversion of the semiconductor layer from n-type to p-type.

Specifically, in certain embodiments, depositing the semiconductor layer on the surface of the corona-charged or contact-charged dielectric layer may result in threshold voltage shifting, conductivity and current modulation, and conversion between the p-type and n-type character of the semiconductor layer. In certain embodiments, depositing the semiconductor layer on the surface of the corona-charged or contact-charged dielectric layer results in threshold voltage shifting and an inversion of the semiconductor layer from n-type to p-type and vice versa.

Charging the dielectric layer may be accomplished using any suitable method known to one of skill in the art. The dielectric layer may include a charge storage layer utilized to store charge. The layer may be interposed between the gate contact and channel. In an exemplary embodiment, the charge storage layer is hydrophobic. In an illustrative example, the charge storage layer is selected from the group consisting of cyclic olefin copolymer, glass resin and poly 4-methyl-styrene. Further examples include $TiO_2$-polysiloxane composites, zinc octaethylporphyrin films, anthracene-methacrylate copolymers, and poly(methylmethacrylate) (PMMA). Polytetrafluoroethylene, copolymers of substituted styrenes and other hydrophobic monomers, and composites of polymers with particles or pores that retain static charges may also be used as a charge storage layer. Other organic-based charge storage materials may be used that are compatible with field effect transistor (FET) fabrication processes and operation. Advantageously, a microcontact-like process, for example, where electrodes mounted on a rubber stamp are used to deliver the one or more voltage pulses, may be used to supply the voltage pulses. Such techniques have been used with PMMA in devices other than FETs, but not in FETs. Other exemplary methods of providing voltage pulses include corona discharge and ion implantation. Energy may be applied during the charging to facilitate charge entry.

In certain embodiments, contact charging may be used, for example, stamp-electrode contact charging. In other embodiments, corona-charging may be used. In such embodiments, the charging is performed with a corona voltage with an absolute value of at about 5 kV to about 30 kV, a grid voltage of about −1 kV to about 1 kV, a charging temperature of at least about 20° C. to at least about 200° C., and a charging time of at least about 1 min to at least about 20 min. The electrode spacings may be such that the electric field strength above air breakdown is about $3 \times 10^6$ V/m.

The charged dielectric layer may be thermally annealed.

Any suitable material for producing a dielectric layer may be used in the methods. For example, the material may be any of inorganic materials, ceramics, polymers, self-assembled films and hybrid materials of any of the foregoing. In certain embodiments, the material is not a ferroelectric material, but may still serve as an electret.

In certain embodiments, the material comprising the dielectric layer is an inorganic material. In other embodiments, the material comprising the dielectric layer comprises silicon, for example, silicon dioxide. In other embodiments, the material comprising the dielectric layer is a glass, for example, poly(phenyl-methyl-silsesquioxane).

In certain embodiments, the material comprising the dielectric layer comprises an additive or has been subjected to a surface treatment to make the material more hydrophobic. Thus, the method may further comprise (b)' subjecting the deposited dielectric layer to a surface treatment to make the dielectric layer more hydrophobic.

Any suitable material for producing a semiconductor layer may be used in the methods. For example, the material may be any of organic semiconductors, polymeric semiconductors, nanostructured semiconductors, dry transferred semiconductors, and semiconductors that are mixtures of at least two of organic semiconductors, polymeric semiconductors, or nanostructured semiconductors. The semiconductor layer may be a separate layer or a modification to a portion of the dielectric layer. For example, oxygen plasma or other chemical oxidation methods may be used to modify the surface of dielectric layer to form an interface layer.

In certain embodiments, the material comprising the semiconductor layer is an organic semiconductor, for example, copper hexadecafluorophthalocyanine or 5,5'-bis(4-hexylphenyl)-2,2'-bithiophene. Other illustrative organic semiconductors include, but are not limited to, phenylene-thiophene oligomers, for example, 5,5'-diphenyl-2,2'-bithiophene, 5,5"-diphenyl-2,2',5',2"-terthiophene; 5,5"'-diphenyl-2,2',5',2",5",2"'-quaterthiophene; 1,4-bis(5'-hexyl-2,2'-bithien-5-yl)benzene and N,N'-bis(2,2,3,3,4,4,4-heptafluorobutyl)naphthalene-1,4,5,8-tetracarboxylicdiimide. Other illustrative examples include, but are not limited to, thiophene-thiazole oligomers, for example 2,5-bis(2,2'-bithien-5-yl)thiazole and 5,5'-bis(5'-hexyl-2,2'-bithien-5-yl)2,2'-bithiazole; and benzodithiophene-based compounds, for example, 2,2'-bis (benzo-1,2-b:4,5-b'-dithiophene). Other organic materials that have properties desirable for an organic semiconductor are phenylene oligomers and co-oligomers and copolymers of thiophene and fluorene.

The difference between the threshold gate voltages of the organic semiconductors formed in two of the regions is at least about ten volts per micron of dielectric thickness into the accumulation regime.

Any suitable material for producing an electrode may be used in the methods. For example, the electrode may be any of a metal, conducting polymer, conductive ink or paint.

In certain embodiments, the method may comprise (a) depositing a dielectric layer on a substrate; (b) charging the dielectric layer to create at least two regions in the dielectric layer having different charge levels; (c) depositing a semiconductor layer on the surface of the charged dielectric layer; and (d) depositing at least two electrodes such that at least one of the electrodes is disposed on a region different from the region on which at least one of the other electrodes is disposed.

The method may further comprise integrating the at least one electrode into at least one transistor. In certain embodiments, depositing the semiconductor layer on the surface of the dielectric layer results in conversion between the p-type and n-type character of the semiconductor layer, so that the transistor is an inverted carrier transistor.

In certain embodiments, the transistor is a polarizable gate transistor. A polarizable gate transistor may be used as an information storage device and as an element in adaptive, synaptic, and amplifying circuits. Charge storage or polarization between the transistor's gate contact and semiconductor channel imposes an added voltage between the gate contact and channel, thereby altering the effective channel voltage relative to the voltage nominally applied at the gate contact ("gate voltage").

The transistors provided herein may operate as polarizable gate transistors wherein the effective gate voltage applied to its channel is shifted relative to the gate voltage. A primary advantage is the creation of additional device states, which can be read as stored information. Furthermore, polarizable or altered gate devices can function more effectively in certain circuits. The effective threshold voltage can be brought very close to zero for applications where the available gate voltage is limited. The transconductance of the device can be increased, since the apparent gate voltage necessary to produce a given drain current can be reduced. Resonant and adaptive circuits can be tuned in situ through polarizable gates, pseudo CMOS circuits can be fabricated from transistors of one carrier type, and the sensory properties of organic FETs may be optimized or diversified.

In certain embodiments, the transistor gate voltage is shifted by at least about five volts per micron of thickness of the dielectric layer, at least about ten volts per micron of thickness of the dielectric layer, or at least about twenty volts per micron of thickness of the dielectric layer. Alternatively, the transistor gate voltage may differ from the effective gate voltage by at least about five volts per micron of thickness of the dielectric layer, at least about ten volts per micron of thickness of the dielectric layer, or at least about twenty volts per micron of thickness of the dielectric layer.

Embodiments of the invention provide a circuit configured to operate an organic polarizable gate device. In particular, circuits are disclosed that operate a field effect transistor (FET) with an organic gate dielectric as a polarizable gate device. The polarizable gate FET stores data in its gate-charged state. Advantageously, the circuits can be constructed with organic reel-to-reel technology, which is relatively inexpensive and may be useful to construct memory devices. This is an attractive alternative to fabrication processes which require vacuum technology which entails removing a work piece from an assembly line to insert it into a vacuum chamber. In reel-to-reel technology, material may be deposited instead via a liquid medium.

Numerous circuit types are possible according to illustrative embodiments of the invention. Exemplary embodiments include circuit types such as CMOS compatible floating gate elements, analog memory elements, capacitor-based circuits, adaptive circuits and learning networks which may be used in conjunction with organic polarizable gate transistors.

One application of organic electronics is chemical sensing, especially of vapors. This is due to the ability to covalently attach receptors for compounds of interest to the molecules that make up the semiconductor, in locations where analyte-receptor binding will strongly influence the current flowing across a transistor channel. There is a preferred gate voltage at which superior sensitivity to a vapor of interest is achieved. The preferred gate voltage for chemical sensitivity, which varies depending on the semiconductor, could be preset in the dielectric, eliminating the need for the gate contact in a particular OFET. This also offers an avenue for having an array of devices with the same semiconductor but different underlying stored voltages, indicated by the plus signs within the series of channels pictured in FIG. 21. This greatly increases the convenience of using a sensitive OFET platform in the field, and stabilizes the devices against hysteresis. This also offers a larger set of electrical response data to aid in identification of the sensed vapor.

Figure 21:
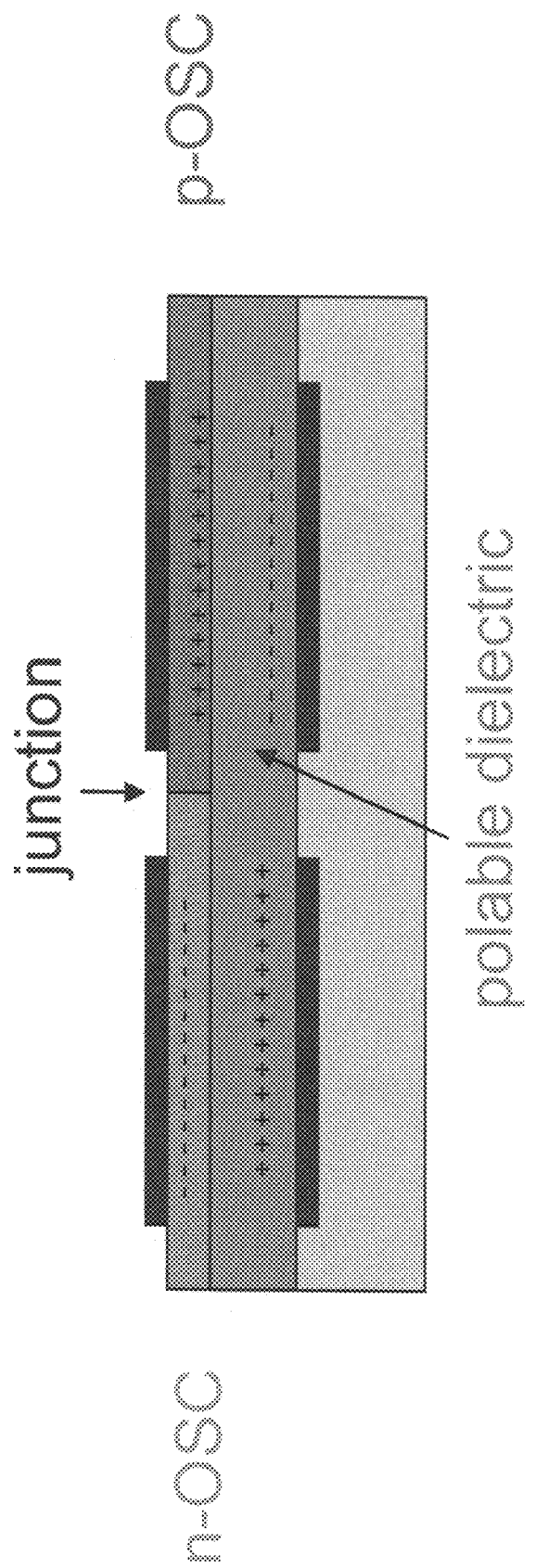
FIG. 21 depicts an exemplary PN junction made from higher-conductivity organic semiconductors and a poled, underlying dielectric.

The exemplary embodiment depicted in FIG. 21 is optimized for OFETs. The design principle, however, may be extended to other types of circuits and display elements such as liquid crystals, electrophoretic devices and electrochromic devices. In such cases some modifications to the pixel circuitry may be needed. For example, the addressing scheme may be varied or the circuit may be configured as a voltage source as opposed to a current source.

The at least one transistor may be integrated into one or more of the following: an inverter, an amplifier, a ring oscillator, a rectifier, and a sensor. In certain embodiments, the at least one transistor may be integrated into an array of at least one or more of the following: an inverter, an amplifier, a ring oscillator, a rectifier, and a sensor.

Rectification and photoinduced charge separation across organic pn junctions in the generally lateral high-mobility directions of organic solids represent relatively uncharted territory. Charge carrier separation should be more efficient because of the reduction in scattering sites when charge transport is parallel to crystal axes of high intermolecular orbital overlap, the basis of high charge carrier mobility. P-n pairs of OSCs as side-by-side films are expected to show rectifying activity and photovoltaic effects. Charge separation at the p-n junction should be enhanced by the quenching of traps in the semiconductors when the dielectrics are charged. An exemplary p-n junction made from higher-conductivity organic semiconductors and a poled, underlying dielectric is shown in FIG. 22.

Figure 22:
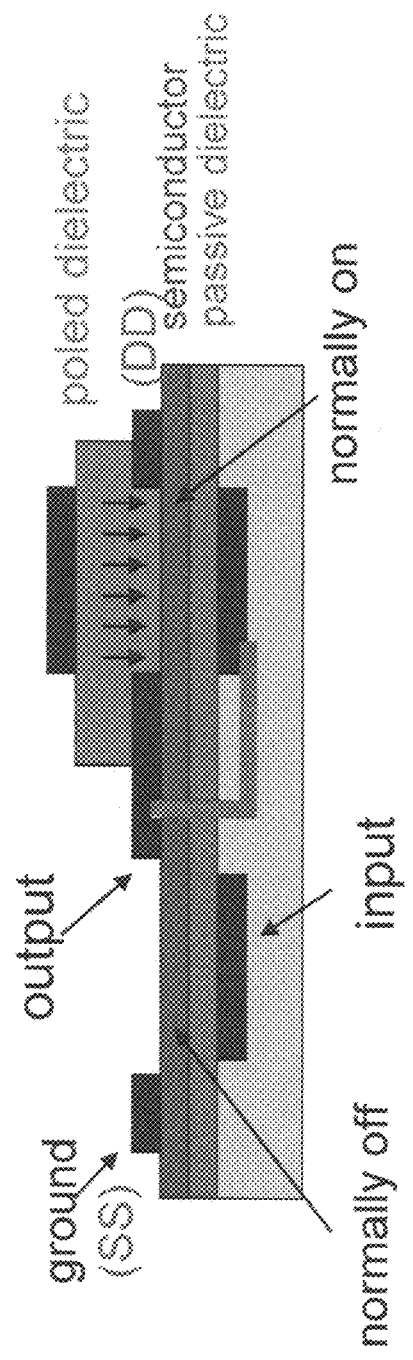
FIGS. 22 and 23 depict different schematics of a layout for an inverting amplifier based on poled dielectric top gate. Application of increased input voltage to turn on the left transistor decreases the output voltage to ground from the value set by the voltage applied to the rightmost electrode (VDD). The top right contact acts as a bias point, useful for powering and tuning the device when it is employed as an amplifier.
Figure 23:
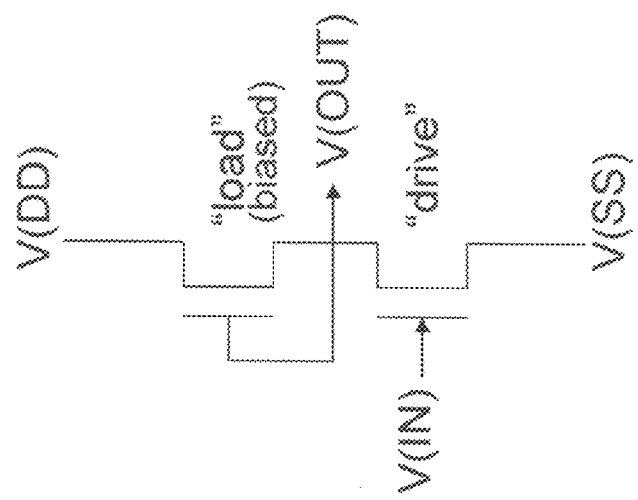

A layout for an inverting amplifier that takes advantage of a poled dielectric to create a "normally on" region of the semiconductor is shown in FIGS. 22 and 23.

If sufficient power is applied to the rightmost ($V_{DD}$) electrode, the device of FIGS. 23 and 24 functions as an inverting amplifier. In addition, these inverters can be cascaded to form ring oscillators, meaning that an odd number of input-output pairs will be connected in series, and the last output fed back into the first input. All of these devices can be made from printable electrodes, dielectrics, and semiconductors, do not require semiconductors of two different polarities, avoid the use of chemical doping, and can be adjusted in situ via the poling process. Because the materials used can all be p-channel, generally greater stability associated with p-channel organics versus the n-channel organics that would be needed for complementary inverters may be taken, advantage of. Energy efficiency and "full-swing" (return to zero) operation may be gained by using the "normally on" semiconductor in its depletion mode.

Also provided are apparatus produced by the above-described methods. For example, provided is an apparatus, comprising at least two field effect transistors, wherein each field effect transistor shares the same semiconductor layer and dielectric layer, the dielectric layer being in contact with said semiconductor layer and separating said semiconductor layer from a substrate with at least one gate contact, but wherein each field effect transistor comprises a distinct region of quasipermanent charge in the shared dielectric layer. In certain embodiments, each region of quasipermanent charge retains the charge for a period of time sufficient to allow tuning.

Embodiments of the invention further include a method of electronically storing and reading information utilizing embodiments of the apparatus described herein. As used herein "information" includes digital information, data and/or logic. In an exemplary embodiment of the invention, information is stored in, or read from, a FET coupled to a circuit. The circuit has an output coupled to the FET gate wherein the gate includes a gate contact, a dielectric layer and a path from the gate contact to the dielectric layer. The method includes storing a charge in the regions of the dielectric layer by the circuit supplying one or more storage voltage pulses to the dielectric layer.

The electronically stored information may be all or partially erased by dissipating at least some charge stored in the gate dielectric. Dissipation to erase information may be accomplished in any of the ways described herein.

In an illustrative embodiment of the invention, the method of storing and reading information, utilizes a memory cell wherein the transistor is an information storage device of the cell. Additional embodiments include information storage and reading utilizing the transistors provided herein.

EXEMPLIFICATION

The invention now being generally described, it will be more readily understood by reference to the following examples, which are included merely for purposes of illustration of certain aspects and embodiments of the present invention, and are not intended to limit the invention.

Example 1

Preparation of Complementary Inverter Circuit from Organic Field-Effect Transistors Based on Typical Unipolar n-Channel Copper Hexadecafluorophthalocyanine Semiconductor Thin Films We have found that the giant, stable electric field that couples to OSC thin films when they are deposited on corona-charged gate dielectrics can enable an inversion layer to be formed by moderate additional gate voltages. Thus, pairs of unipolar accumulation-mode and inversion mode OFETs may be formed from the same OSC. Complementary inverters can be realized by these pairs of OFETs. In this Example, we describe the preparation of OFETs and complementary inverters based on copper hexadecafluorophthalocyanine ($F_{16}CuPc$) semiconductor thin films working as effective unipolar devices both in accumulation (n type) and inversion (p type), deposited on a silicon dioxide quasipermanent charge-patterned electret as a gate insulator and using gold as a high work-function metal for the fabrication of the source and drain electrodes. Not only is this the first example of complementary logic elements made from a single OSC operable under ambient conditions, it is also the first demonstration of OFET fabrication on a dielectric in which a voltage is stored and then retained throughout the fabrication process.

Thin-film transistors and complementary inverters were made using heavily doped p-type Si wafers as substrates and common gate electrodes with a 300 rim thermally oxidized $SiO_2$ layer as the gate dielectric having a measured capacitance per unit area of 10.9 nF $cm^2$ (FIG. 1). The $SiO_2$ layer was treated with the primer hexamethyldisilazane (HMDS) prior to corona charging in order to passivate its surface. The hydrophobic $SiO_2$ surface makes the injected charges more stable. The ANDS-treated wafer was locally corona-charged through a slit in a grounded circuit board metallized on one side and placed on top of the oxide sample, leaving patterns of charges in the $SiO_2$ film. The negative charging was performed by a point-to-grid corona apparatus with a corona voltage of −12 kV and a grid voltage of −400 V at room temperature. A charging period of 10 minutes was sufficient to obtain a homogeneous charge distribution over the sample. The effective surface potential Us and charge density σs of the charged area were −318 V and 3.46 µC $cm^{-2}$, respectively, measured by a compensation method using a Monroe ISO-PROBE® non-contacting electrostatic voltmeter (model 244) with a high frequency probe (Model 1017). The time constant for decay of the charge under ambient conditions was on the order of years, while in the absence of the HMDS layer, the charge decayed over a few weeks.

The $F_{16}CuPc$ semiconductor thin films were prepared by vacuum deposition on charge-patterned $SiO_2$ wafers at a substrate temperature 80° C. under a pressure of 1×10-6 mbar, and the thickness of the resulting film was 25 nm. Finally, the gold source and drain contacts (thickness of 50 nm) were evaporated through a shadow mask, defining a channel length of 50 µm and a width of 2 mm. The complementary inverter was simply fabricated by evaporating gold source and drain electrodes on both the charged area and non-charged area, both covered by the single $F_{16}CuPc$ layer on a substrate (FIG. 1).

Figure 2:
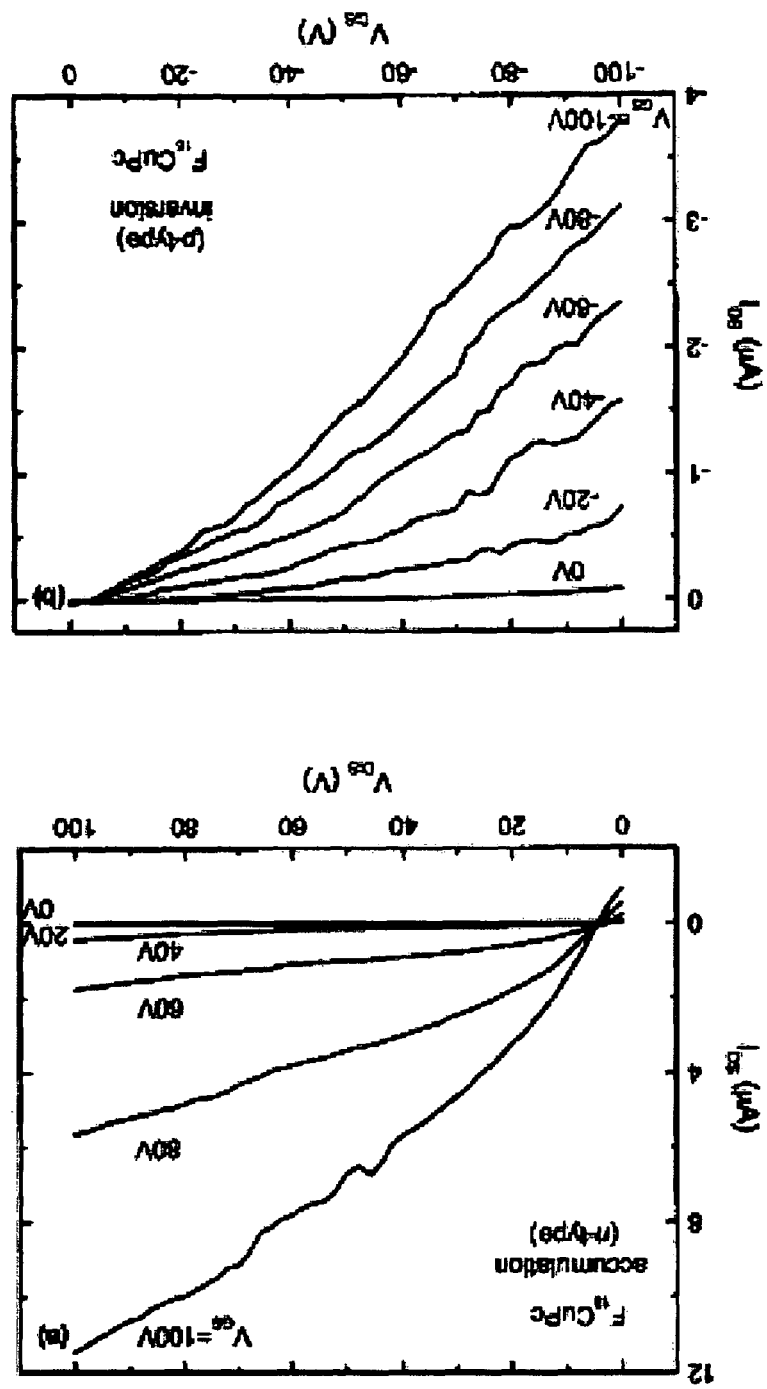
FIG. 2 depicts a drain current ($I_{DS}$) versus drain-source voltage ($V_{DS}$) characteristics at room temperature of (A) an $F_{16}CuPc$ OFET with $SiO_2$ (HDMS-coated) gate dielectric in accumulation mode (n-type, top) and (B) an $F_{16}CuPc$ OFET with $SiO_2$ charged electret gate in inversion mode (p-type, bottom), for utilization in the complementary inverter. $V_{GS}$ is gate voltage.
Figure 3:
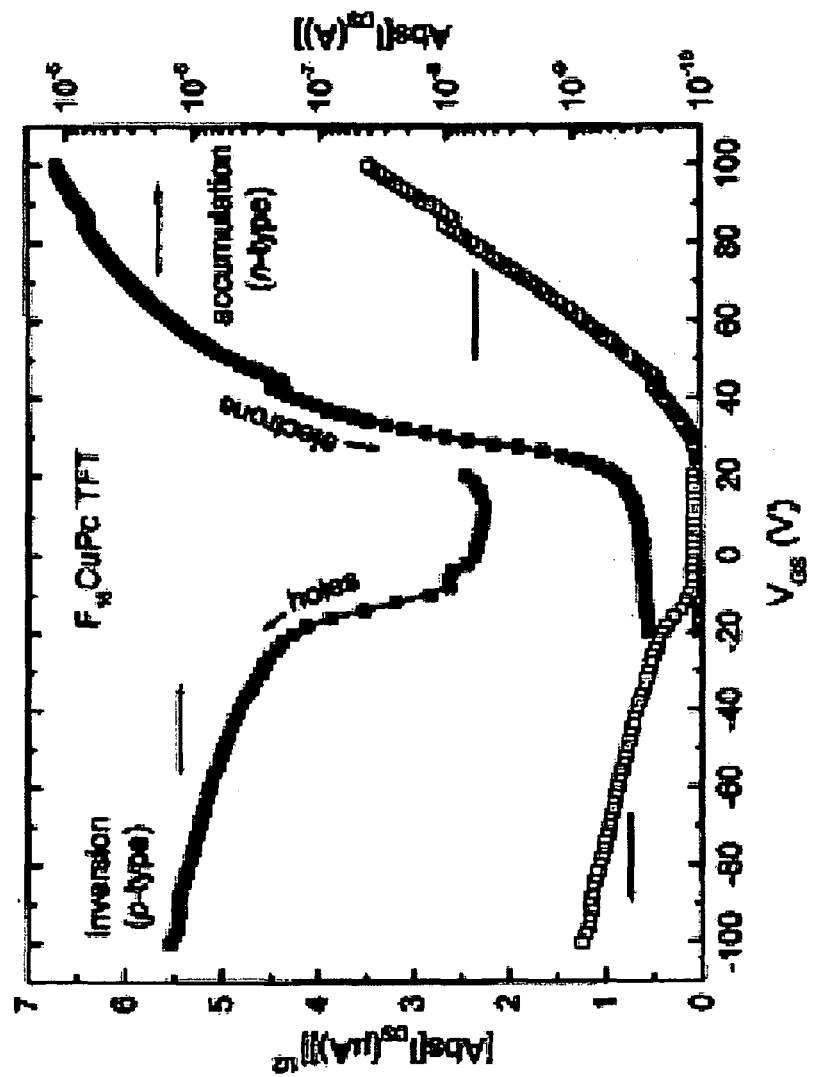
FIG. 3 depicts drain current versus gate voltage characteristics at room temperature of an $F_{16}CuPc$ OFET with $SiO_2$ (HMDS-coated) gate dielectric in accumulation mode (n-type, right) and an F16CuPc OFET with $SiO_2$ gate charged electret in inversion mode (p-type, left), for utilization in the complementary inverter. The field-effect mobilities of the n and p-type transistors are 0.016 and 0.01 $cm^2 V^{-1} s^{-1}$, respectively. The on/off current ratio is 400 and 40000 for p- ($V_{DS}=-50V$) and n-channel ($V_{DS}=100V$) operation, respectively.

Typical device characteristics at room temperature of an $F_{16}CuPc$ OFET (FIG. 2A), measured in ambient air using an Agilent 4155C semiconductor parameter analyzer with coaxial cables and probes, show the device working in typical n-channel unipolar accumulation mode when $F_{16}CuPc$ was deposited on the $SiO_2$ uncharged gaze insulator area. The field-effect electron mobility calculated for the device using the data shown in FIG. 3 is 0.016 $cm^2$ $V^{-1}s^{-1}$. The on/off current ratio at 100 V for enhancement mode-only operation is about 40000. Typical threshold voltages are in the range of 25V, indicating a large concentration of traps. When $F_{16}CuPc$ was deposited on the charged area of the $SiO_2$ gate insulator, the characteristics at room temperature of an $F_{16}CuPc$ OFET (FIG. 2B), measured in ambient air, indicate the device working in typical pchannel unipolar operation, indicating that a strong n-top inversion occurred. The field effect hole mobility calculated for the device from the data shown in FIG. 3 is 0.010 $cm^2$ V-1 $s^{-1}$. An on/off current ratio of about 400 at −50 V and low threshold voltage in the range of 10V are measured for the operation in inversion mode. It is noteworthy that both the p- and n-channel $F_{16}CuPc$ transistors work exclusively in unipolar mode, in contrast to most single-component OFETs capable of both p and n operation.

Figure 4:
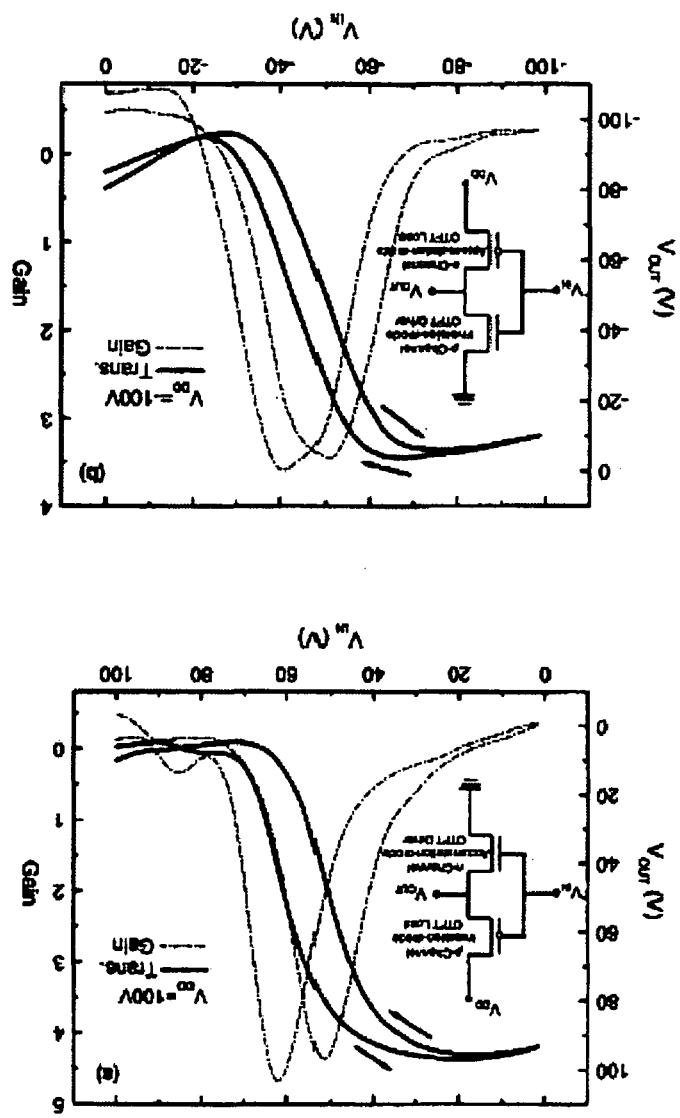
FIG. 4 depicts quasistatic transfer characteristics of the complementary inverter circuits comprised of a continuous layer of two $F_{16}CuPc$ transistors on the same chip (the channel dimensions for both OTFTs were identical and equal to L=50 μm, W=2 mm, and operation frequency f=10 mHz). Depending on the polarity of the supply voltage, $V_{DD}$, and the electrical connections of source and drain electrodes, the inverters work in the first or the third quadrant. Schematic representations of the electrical connections in two inverters are given in the insets. (A) Inverter characteristics (solid line) and the corresponding measured gain (dashed line) with $V_{IN}$ and $V_{DD}$ being positively biased for the device as schematically shown in FIG. 1. The n-channel F16CUPC transistor is the driver and the inversion p-channel F16CuPc transistor is the load. The inset shows the corresponding inverter circuit configuration. (B) Inverter characteristics with $V_{IN}$ and $V_{DD}$ being negatively biased. The transistor types are reversed, and the p-channel $F_{16}CuPc$ transistor is the driver and the inversion n-channel F16CuPc transistor is the load. The inset shows the corresponding inverter circuit configuration. ($V_{IN}$ input voltage, $V_{OUT}$ output voltage).

The transfer characteristics of the complementary integrated inverter with an inversion-mode transistor and an enhancement-mode transistor from a single-component continuous layer of $F_{16}$CuPc thin film on the same substrate are shown in FIG. 4. In these inverters, the unipolar p-channel inversion transistor is on the charged area of the gate dielectric and the unipolar n-channel enhancement transistor is on the uncharged area of the gate dielectric as shown in FIG. 1. The insets in FIG. 4 display the schematic of the complementary inverter circuits employed and the electrical connections of the source and drain electrodes. The inversion p-channel $F_{16}$CuPc OFET is used as the load in the first circuit configuration (FIG. 4A) and as the driver in the second configuration (FIG. 4B). The channel dimensions for both OFETs were the same in both cases and equal to L=50 µm, W=2 mm. In both the inverter circuits the gates are common for both transistors and serves as the input node ($V_{IN}$). The electrical characterization for organic complementary inverters was performed using an Agilent 4155C semiconductor parameter analyzer with coaxial cables and probes as well as a digital voltmeter. When the supply voltage ($V_{DD}$) and $V_{IN}$ are biased positively (FIG. 4A) the inverter works in the fmt quadrant of the output voltage ($V_{OUT}$) versus $V_{IN}$ plot, exhibiting a maximum voltage gain of 5. Under these bias conditions the n-channel $F_{16}$CuPc transistor is the driver and the inversion p-channel $F_{16}$CuPc transistor is the load. If the electrical connection of the source and drain electrodes of the inverter is oppositely arranged (FIG. 4B), and the input and the bias voltage are negative, the inverter still operates in the third quadrant of the $V_{OUT}$ versus $V_{IN}$ plot. Under these bias conditions the transistor types are reversed, and the p-channel $F_{16}$CuPc transistor is the driver and the inversion n-channel $F_{16}$CuPc transistor is the load. The maximum gain is –4, lower than that in first quadrant since the n-channel transistor has higher mobility than p-channel transistor here. Further improvements are expected from increasing carrier mobility and electrode modification, and from reducing overlap capacitance. It is worth noting that since unipolar OFET complementary inverters operate only in one quadrant (i.e., either in the first or third), the ability to operate in both quadrants of the $V_{OUT}$ versus $V_{IN}$ plot is a unique feature of inversion OTFT complementary inverters in which both p- and n-channels act exclusively in unipolar mode for single-component organic semiconductor thin films with n- and p-channel function exchanged by patterning of charged electrets, similar to ambipolar OTFT complementary inverters.

Figure 5:
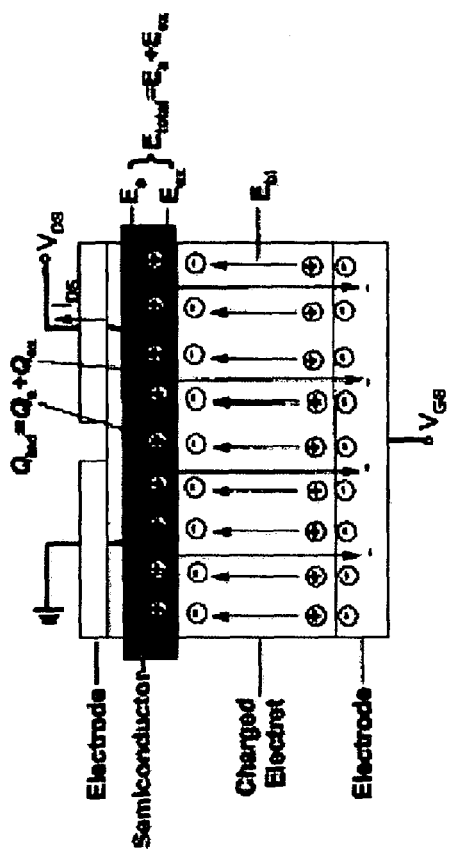
FIG. 5 depicts a possible operation mechanism for the organic field-effect inversion transistor on the charged electret. The total charge density induced by the sum of the giant electric field coupling to the semiconductor following corona charging of the gate dielectric plus the gate voltage is large enough to compensate the traps at the interfaces and then produce a sufficient number of mobile carriers (the effective mobile inversion layer charges) in the conducting channel, which leads to a strong inversion operation. ($E_{bi}$ is the built-in electric field of the charged electret; $E_a$ is the compensated electric field inside the organic semiconductor between the thin-film electret and source-drain electrode which results in hole accumulation with the positive charge density of $Q_a$, in the inversion channel, $E_{ex}$ external electric field from the gate voltage which results in a inversion layer hole accumulation with the positive charge density of $Q_a$, and $E_{total}$ total electric field, which is above the breakdown field $E_B$ of the $SiO_2$ dielectric, for the total hole accumulation with the positive charge density of $Q_{ind}$ in the inversion layer)

When a subsequently evaporated organic semiconductor is deposited on the surface of the charged electrets, the stored negative charges in the bulk of the insulator not only generate internal built-in electric fields $E_{bi}$ but also give rise to an electric field $E_a$ directed to and partly inside the semiconductor. This $E_a$ field follows variations of the injected negative charge density and modulates the charge density of a channel inside the organic semiconductor (FIG. 5). The voltage one needs to compensate the $E_a$ field corresponds to the surface potential $U_s$. Under zero-gate-bias condition, the transport of mobile carriers under the $E_a$ field results in a positive charge accumulation at the $F_{16}$CuPc semiconductor—SiO$_2$ electret interface until the electrostatic balance is reached where there is no electric field inside the semiconductor (the built-in electric field $E_{bi}$ is associated with the bulk of the charged electret). The effective surface-charge density 6 S of the charged electret layers, corresponding to the effective surface potential $U_s$, can be seen as the charges at the electret surface with the density o$_s$ that generate the $E_a$ field, while o$_s$ represents the charge density $Q_{ind}$ induced in compensating the $E_a$ field in the OSC.

Due to effective trapping of $F_{16}$CuPc thin films, a low negative gate voltage on the uncharged SiO$_2$ gate dielectric cannot provide an electric field $E_{ex}$ which is sufficient to accumulate positive charges to compensate these traps and also induce an inversion layer at the surface of the OSC. An additional gate electric field, even above the breakdown field of the gate dielectric, must be applied to drive the organic field-effect transistors to induce sufficient mobile inversion layer charges. Using the corona charged SiO$_2$ gate dielectric, a strong n-top inversion operation was observed in the thin-film transistor fabricated of $F_{16}$CuPc thin film. For the device shown in FIG. 1, the effective surface potential $U_s$ was –318 V which generated an effective field $E_a$ of –1060 V/µm for the thickness of 300 nm of SiO$_2$. With the external gate voltage of –100 V which generates the external electric field $E_{ex}$ of –333 V/µm, the total effective electric field $E_{total}$ to induce positive charge accumulation is –1393 V/µm which is larger than the reported theoretical maximum field strength of –1200 V/µm for silicon dioxide that could be produced by corona charging. In comparison, the effective electric field in the bulk gate dielectric is 727 V/µm, below the reported theoretical maximum field strength. The induced positive charge density Q. at the interface is 3.46 µC cm$^{-2}$. With the induced positive charge density $Q_{ex}$ of 1.09 µC cm$^2$ by external gate voltage of –100 V, the total induced positive charge density Qtotal is 4.55 µC cm$^{-2}$ which is large enough to compensate the traps and also induce a strong inversion.

The lower hole mobility and on/off current ratio compared to that of n-channel operation indicate that in the inversion p-channel regime transistor operation is contact limited. We attribute this to the presence of an injection barrier for holes at the Au/$F_{16}$CuPc interface. This observation also suggests either presence of a density of hole traps at the SiO$_2$/$F_{16}$CuPc interface and/or the existence of a contact barrier for hole injection from Au into the HOMO of $F_{16}$CuPc in the inversion operation. Despite this barrier the inversion transistors still operate with inversion p-channel function, exhibiting the inversion carrier mobilities in the order of 0.01 cm2 V$^{-1}$ s$^{-1}$ and a low threshold voltage of 10 V.

In summary, we have observed a strong inversion in OFETs using a dielectric possessing quasipermanent charge storage as a gate insulator. The conventional corona charging technique on gate dielectrics provides an efficient method to produce a giant electric field which is sufficiently large to induce, in combination with the gate voltage, an inversion layer at the surface of OSC thin films. The OFETs from single-component organic semiconductor thin films operate in accumulation mode and inversion mode in ambient air, and both n- and p-channel transistors work exclusively in unipolar mode. Consequently, we have demonstrated complementary unipolar inverters with these electret-induced inversion transistors. With metals with appropriate work function as source and drain electrodes for p- and n-channel operation, OFETs with higher mobilities and on/off current ratio and complementary inverters with higher gains could be prepared. The use of inversion organic thin-film transistors for the fabrication of complementary logic gates utilizing a single layer of a single component organic semiconductor thin film transistors can be viewed as a significant step towards organic electronic circuits. In addition to the simplification of processing, organic semiconductor thin-film devices based on electret-induced inversion layers and their structures potential applicability to induced junction solar cells, in nonvolatile memory transistors, in chemical and biosensors, in infrared imagery, and in other novel organic devices relying on inversion layers for their operation. This structure also provides a novel method of studying interface fields, interface states, and charge injection of organic semiconductors and dielectrics.

Example 2

Preparation of Organic Field-Effect Transistors and Unipolar Logic Gates on Charged Electrets from Spin-On Organosilsesquioxane Resins In this Example, we present a detailed study of OFETs which are primarily charged after the deposition of dielectrics, but before the deposition of OSC and the application of the source and drain. The charging process can be monitored using surface charge measurements on the dielectrics, and correlated with further observations made on the complete devices. Because different regions of the dielectric can be charged to different degrees, distinct devices can be positioned on a single substrate, even though the dielectric and semiconductor are the same in all the regions. Thus, pair of accumulationmode and depletion-mode OFETs can be formed from the same OSC, and full-swing unipolar inverters can be realized by these pairs of OFETs with the same channel dimensions.

Experimental 2.1 Spin-On Organosilsesquioxane Resins as Charged Electrets

The performance of OFETs critically depends on the choice of gate dielectrics. Thermally grown $SiO_2$ on doped Si substrate was mainly used to characterize semiconductor properties in OTFTs because of its ready availability and superior electrical properties, as confirmed by conventional Si-based field-effect transistors. For large-area organic electronics, however, processability must be taken into account; polymeric dielectrics are very attractive gate dielectric materials because of their solution-processability, leading to low fabrication cost. A charged electret is a dielectric with quasipermanent charge trapped inside, which generates strong electrostatic field. Although there are several electret polymer materials such as poly(tetrafluoroethylene) possessing high charge storage properties, unfortunately, poor surface morphology for the crystallization of OSC films, and difficult thin film (<1 µm) processing from solution make them undesired gate electrets for our purpose. Recently, siloxane-based spin-on glass resins, a candidate for nanostructured low -k dielectrics for advanced microelectronic devices, have been successfully used as high-performance dielectric materials for organic transistor applications. The commercially available precursors of these siloxane polymers are soluble in common organic solvents and can be applied by conventional liquid coating technologies which provide highquality films over a large area, leading to a low fabrication cost. Their low curing temperature permits the use of a variety of low-cost plastic materials as substrates in OFET devices. On the other hand, glass resin also exhibits highly stable charge storage as charged electrets. Unlike the traditional thermally grown and Sol-gel prepared silicon dioxide inorganic electrets films, solution processibility and subsequent high-quality thin films make glass resin promising for gate electrets of charged OFETs.

Figure 6:
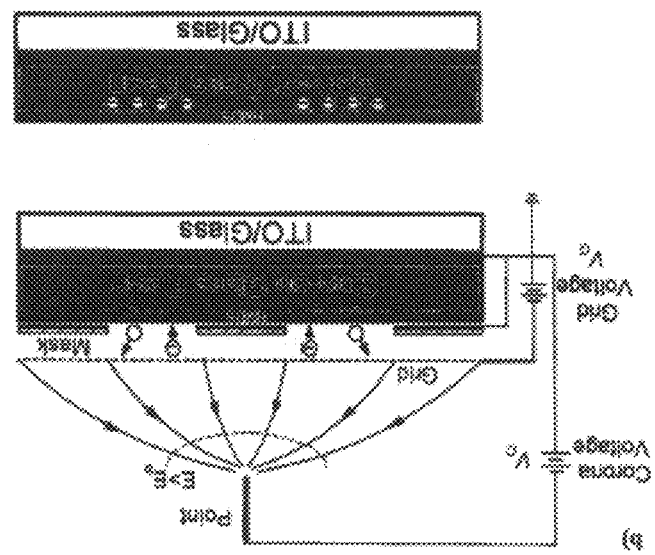
FIG. 6A depicts the molecular structure of poly(phenyl-methyl-silsesquioxane) (pPMSSQ) polymer as spin-on organosilsesquioxane glass.
FIG. 6B is a schematic of the point-to-grid corona triode apparatus with one metallic control wire grid and mask for uniform and large-area depositing and patterning of charge in thin-film electrets. Curves with arrows represent the distribution of electrostatic field lines in air. The dotted curve represents the breakdown line (E>Eb) in air. Circled minus signs above the glass resin represent the negative ion carrying electron in air, and circles above the glass resin represent the neutralized molecule which has released the electron. Minus and circled minus signs in the glass resin represent the electrons and trapped charges, respectively. The charge distribution inside the glass resin is controlled by both the charging and subsequently annealing conditions. $V_C$, the corona voltage, and $V_G$ the control grid voltage.
Figure 6:
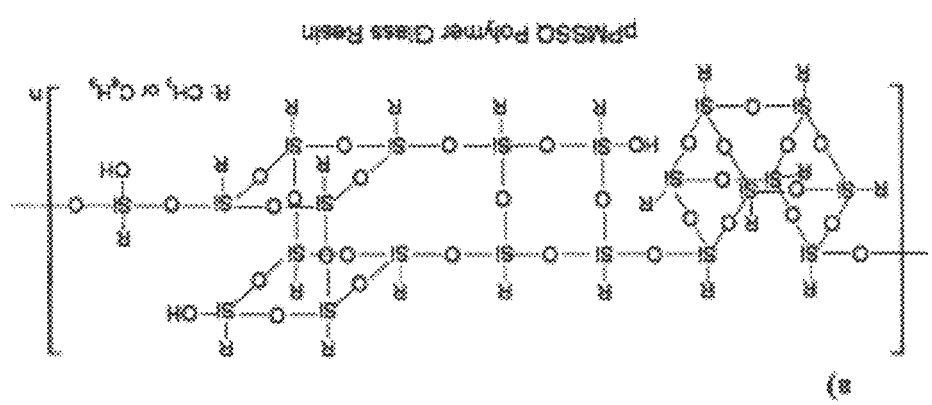

The glass resin GR-150F flake material was used for our purpose. FIG. 6A schematically shows the molecular structure of poly(phenyl-methyl-silsesquioxane) (pPMSSQ) polymer as spin-on organosilsesquioxane glass resin. The partially cross-linked pPMSSQ in an appropriate solvent is solution processable, and its solution viscosity can be adjusted to suit various solution deposition techniques. After deposition, subsequently thermal curing of the pPMSSQ layer affords a three-dimensional alternating network of polymer dielectric, leading to excellent dielectric properties. The thermally cross-linked pPMSSQ, forming either ladder or cage structures, are usually built on an 0-Si—O backbone, which are more like $SiO_2$ than other organic polymers. Thus, they have a perceived advantage over other polymers. pPMSSQ having both methyl and phenyl pendant groups (90% phenyl, 10% methyl content) is quite hydrophobic when fully cured due to a very low concentration of hydroxyl groups present in the thermosetting polysiloxane polymer.

Prior to deposition of glass resin materials, the ITO (indium tin oxide)-coated glass substrates (Delta Technologies, Ltd.) were sequentially cleaned with Branson GP concentrate solution, acetone, methanol, and de-ionized water in ultrasonic cleaners. The glass resin GR-150F flake, purchased from Techneglas, Inc., was dissolved in n-butanol at a concentration of 35 wt %. The glass resin solution was pre-filtered three times using syringe filters having pore sizes of 0.2 µm. The ITO/glass substrate was rinsed with isopropanol, and subsequently a glass resin solution was dispensed onto the substrate, followed by spinning at 1500 rpm for 30 seconds. The resulting substrates were subsequently heated on hot stage set at 135° C. for 12 hrs and then 350° C. (well below the air oxidation temperature) for 2 hrs. Double spin casting of glass resin solution on the ITO surface achieves an approximate thickness of 1 µm. The glass resin cured at 350° C. retains relatively little SiOH functionality. Nevertheless, the glass resin curved film was exposed to hexamethyldisilazane (HMDS) vapor prior to corona charging, in order to complete the hydrophilic-to-hydrophobic conversion of the surface with a trimethylsilyl (TMS) monolayer, making the injected charges more stable. Typically, HMDS-treated glass resin films with 1 pm in thickness were used for corona charging and as gate dielectric having a measured capacitance per unit area C, R of 3.0 nF $cm^2$.

2.2 Corona Charging Systems and Process Control of Corona Charging and Subsequently Annealing The HMDS treated glass resin was locally and negatively corona-charged through a slit in a grounded circuit board metallized on one side as a mask and placed on top of the glass resin sample, leaving patterns of charges in the glass resin film. The negative charging was performed by a point-to-grid corona triode apparatus with a high corona voltage $V_c$ and a controllable grid voltage $V_G$ at room temperature. In our lab, a corona triode setup with grid voltage control was especially built for allowing charging dielectric foils. FIG. 6B shows a schematic of the point-to-grid corona apparatus, with one metallic control wire grid and one metallic mask for uniform and large-area deposition and patterning of charge in thin-film electrets. As shown in FIG. 6B, when a field near the point electrode exceeds the breakdown strength of the air, corona discharge will occur producing an ion sheath that can be used charge the sample. For the negative point electrode, only negative ions can reach the dielectric material surface. These ions will then give up their attached electrons, becoming neutralized, and return to the surrounding atmosphere, leaving a layer of trapped electrons just below the dielectric surface. Since the electric field distribution around a single point electrode is very nonuniform, with the field decreasing gradually with radial distance from the point, the distribution of the deposited charges on the materials surface is also very nonuniform in a "scorotron" system. To improve this situation, a fine metal mesh screen held at the appropriate potential can be placed between the point electrode and the material surface, as shown in FIG. 6B, similar to a "scorotron" charging subsystem frequently used in electrophotographic processes. The control grid is used both to improve the charge uniformity and to limit the charging of the surface. Ions pass through the grid and deposit on the surface of the materials until the sample surface potential equals the grid potential. At this point, the ions will flow only to the control grid, since the electric field between the grid and the surface of the materials has approached zero. This device acts therefore somewhat like a triode. With the control grid, the distribution of the deposited surface charge is generally uniform if the discharging has reached such a level that the potential at the material surface approaches the potential of the grid. Finally, the effective surface potential $U_s$ and the charge distribution $p(x)$ inside the glass resin can be controlled by both the corona charging and subsequently annealing conditions. The corona charging process parameters include $V_c$, the corona voltage, $V_G$, the control grid voltage, $T_C$, the charging temperature, and $t_c$, the charging time. The annealing process parameters include $T_A$, the annealing temperature, and $t_A$, the annealing time.

A charging period of 10 minutes at room temperature was sufficient to obtain a homogeneous charge distribution over the sample when the point voltage and the grid voltage were chosen. After a heat treatment of 30 minutes at 100° C., the effective surface potential $U_s$ of the negatively corona charged glass resin was measured by a compensation method using a Monroe ISOPROBE® non-contacting electrostatic voltmeter (model 244) with a high-frequency probe (Model 1017). Compared to the Kelvin probe in which the electrode is vibrated vertically, changing the capacitance between probe and sample, in the Monroe probe, the electrode is fixed and a grounded shutter, mounted in front of the electrode, is vibrated horizontally, thereby modulating the probed capacitance. The difference in design makes Monroe probes less sensitive to external vibrations so that the measurement setup need not be vibration isolated and then the effective surface potential profile mapping of patterned charges can be easy to detect by moving the electret film with an x/y-axis micropositioner. The voltage one needs to compensate the external field E. corresponds to the surface potential $U_s$, and the effective surface-charge density os can now be calculated with the relation:

$$\hat{\sigma}_s = \frac{\varepsilon\varepsilon_0 U_s}{d} \quad (1)$$

where $\varepsilon\varepsilon_0$ is the permittivity and d is the thickness of glass resin. The extrapolated time constant for decay of the charge under ambient conditions was on the order of 100 years. The thermal annealing procedure was necessary to relocate the charges from surface or shallow traps to more stable volume or deep traps inside the glass resin layer, as shown by capacitance measurements described below. Therefore, charges were "prestored" in the dielectric and then retained throughout the whole OFET fabrication and operation processes. This is an unprecedented process sequence, offering new options for the fabrication of complex organic circuits.

The negatively charged electrets are controlled by the trapping conditions of the electrons which are injected into glass by means of negative corona charging. In this way they influence the stability and efficiency of the space charges stored in glass resin electret remarkably. To explore the electrostatic process control and charge dynamics in glass resin, a method for determining charge centroid and density was applied to the corona charged and subsequently annealed samples. Glass resin with the thickness of 1 pm was solution deposited onto p-Si substrate, and an aluminum electrode was evaporated at the rear side of the wafer to serve as an ohmic contact to the substrate. The glass resin layers were cured, corona charged and annealed with similar procedures to that of glass resin onto the ITO/glass substrate. In a first setup, the surface potential $U_s$ at the free glass resin surface was measured with a Monroe electrostatic voltmeter. Subsequently, a metal-electret-semiconductor (MES) capacitor was formed by evaporating of aluminum on the front side of the samples. Then, capacitance-voltage measurements were carried out using an Agilent 4284A precision LCR Meter with a bias scan. Compared to an uncharged sample a shift of the characteristic curves (flat band voltage shift) along the voltage axis was observed. This voltage shift AY corresponds to the surface potential at the silicon-glass resin interface, generated by the electret charges.

2.3 Fabrication of OSC FETs and Unipolar Inverters on Charged Electrets

Figure 7:
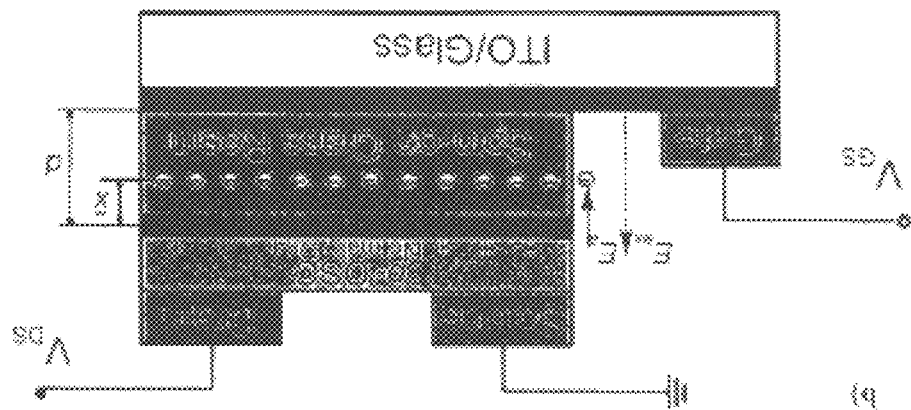
FIG. 7A depicts the molecular structure of 6PTTP6 oligomer as p-type organic semiconductor (OSC).
FIG. 7B is a schematic cross section of organic thin-film transistor with p-type organic semiconductor thin film deposited on corona * charged and subsequently annealed glass resin (the surface of the glass resin was treated with HMDS). x and d are the mean charge depth from free glass resin surface (before OSC deposition) and the film thickness of a one-side metallized (ITO glass as the lower electrode) negatively charged and annealed glass resin., respectively. Circled minus represents the volume charges inside negatively charged and annealed glass resin. Blue and red plus represents the induced positive charges accumulated at the semiconductor-electret interface and the compensation positive charges on the lower electrode under unbiased conditions.
Figure 7:
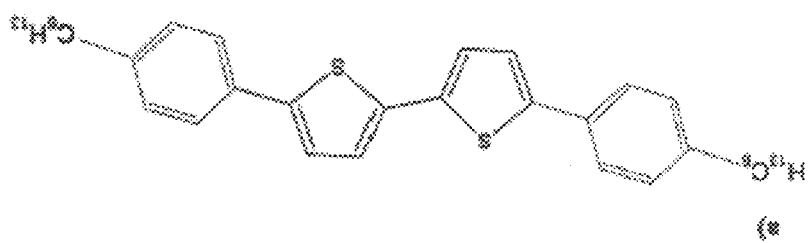

The organic semiconductor 5,5'-bis(4-hexylphenyl)-2,2'-bithiophene (6PTTP6) oligomer was prepared using the standard method and purified by recrystallization. FIG. 7A shows the molecular structure of 6PTTP6. It was chosen because it typically exhibits high p-type carrier mobility, air stability, and possible solution processibility. OFETs with 6PTTP6 on glass resin show predictability of the threshold voltage shift, consistency in mobility, and sharp turn-on characteristics lads. The 6PTTP6 OSC thin films were thermally evaporated through a shadow mask on charged or uncharged glass resin, under a pressure of 1×10-6 mbar in a vacuum evaporator (Edwards/E306A Coating Systems). The thermal control system maintained the growth substrate at room temperature, and the thickness of the resulting film was 50 nm. Finally, the gold source and drain contacts (thickness of 50 rim) were evaporated through a shadow mask, defining a channel length L of 50 μm and a width W of 2 mm. FIG. 2b shows the device configuration of the OFET with 6PTTP6 deposited onto charged glass resin.

The unipolar inverter was fabricated by evaporating gold source and drain electrodes on both the charged area and non-charged area of glass resin, both covered by the single 6PTTP6 layer on a substrate. The channel dimensions for the transistor load and driver remained the same with L=50 um, and W=2 mm. ITO/glass substrate was polished with fine celite before ITO patterning. ITO coated glass, as separate gates for unipolar inverters, was patterned by photolithography with Microposit S1813 positive photoresist and MF-319 developer (Rohm Haas Electronic Materials) and subsequent wet chemical etching with HCl solution.

2.4 Dielectric and Electronic Materials Characterization and Device Testing

Typical electronic characteristics of OTFTs and unipolar inverters were measured in ambient air using an Agilent 4155C semiconductor parameter analyzer with coaxial cables and probes as well as digital multimeters. The mobility values were derived from the drain-source currents at the saturation region. The dielectric capacitance and capacitance-voltage measurements were performed using an Agilent 4284A precision LCR Meter at a frequency of 1 kHz and a level of 0.5 V.

The surfaces of charged and uncharged glass resin gate dielectric were characterized by an atomic force microscope [(AFM) NanoScope IIIa, Digital Instruments]. The surface morphology of the organic semiconductor thin films on charged and uncharged glass resin was determined with a tapping mode by AFM. The results related to the surface chemical composition of the glass resin before and after corona charging were obtained by a PHI 5400 X-ray photoelectron spectrometer. In order to investigate possible correlation between trapping behavior and chemical composition of the electret surface and near surface region, XPS was performed at different takeoff angles, which provides this information at different depths below the sample surface. For example, a takeoff angle of 90° corresponds to a typical escape depth of 10 nm, while for a grazing takeoff angle (20°) this value would be 2 nm. This allows one to distinguish possible compositional differences between the surface and "bulk" regions of a given sample. X-ray diffraction (XRD) scans of the 6PTTP6 thin films on uncharged and charged glass resin were carried out by a Phillips X Pert Pro X-ray Diffraction System.

Results and Discussion 2.5 OFET Threshold Voltage Shift and Controllable Tuning on Charged Electrets Typical output characteristics of a 6PTTP6 OEFT show the device working in typical p-channel unipolar accumulation mode when a 6PTTP6 OSC was deposited on normal glass resin gate insulator. The field-effect hole mobility calculated from the devices is 0.05 cm$^2$ V$^{-1}$ s$^{-1}$, the saturation region. The on/off current ratio for enhancement-mode-only operation is about $10^4$ measured at a drain-source voltage $V_{DS}$ of −80 V. In comparison, when a 6PTTP6 OSC was deposited on the corona charged and annealed glass resin gate dielectric, there is a significantly increased current output, and a positive threshold voltage shift in the transfer characteristics, while the hole mobilities of these devices remains almost the same (the reduced carrier mobility in high electric fields for the devices with higher positive threshold voltage is likely due to the carrier injection barrier of OSC-electrode contact). It is noted that both the shift in onset voltage for channel formation and the current of the OFETs were enhanced with the increase of the effective surface potential of the glass resin gate dielectrics. We have measured the relationship between the measured effective surface potential $U_s$ of charged and annealed glass resins and the threshold voltage shifts AVT (data not shown). The threshold voltage shifts were determined from the transfer characteristics of OFET deposited on the corresponding charged and annealed glass resins. The observed quasi-linear relationship indicates that the stored charge can replace the normal gate dielectric for the purpose of the OFET tuning. Since the effective surface potential of gate dielectric is controlled by the charging and subsequently conditions, the grid controlled corona charging process prior to semiconductor and electrode deposition results in the controllable threshold voltage shift and current modulation in OFETs.

The observed threshold voltage offsets and controllable tuning in electrical characteristics of 6PTTP6 OFETs on charged electrets cannot simply be ascribed to chemical doping or a gate-induced direct doping of charges. Negative corona charging would not be expected to direct deliver holes to the dielectric surface. We will discuss two mechanisms possibly involved in the shift of the threshold voltage: the influence of the film morphology by corona charging and the electrostatic induction effect of the charged electrets.

Figure 8:
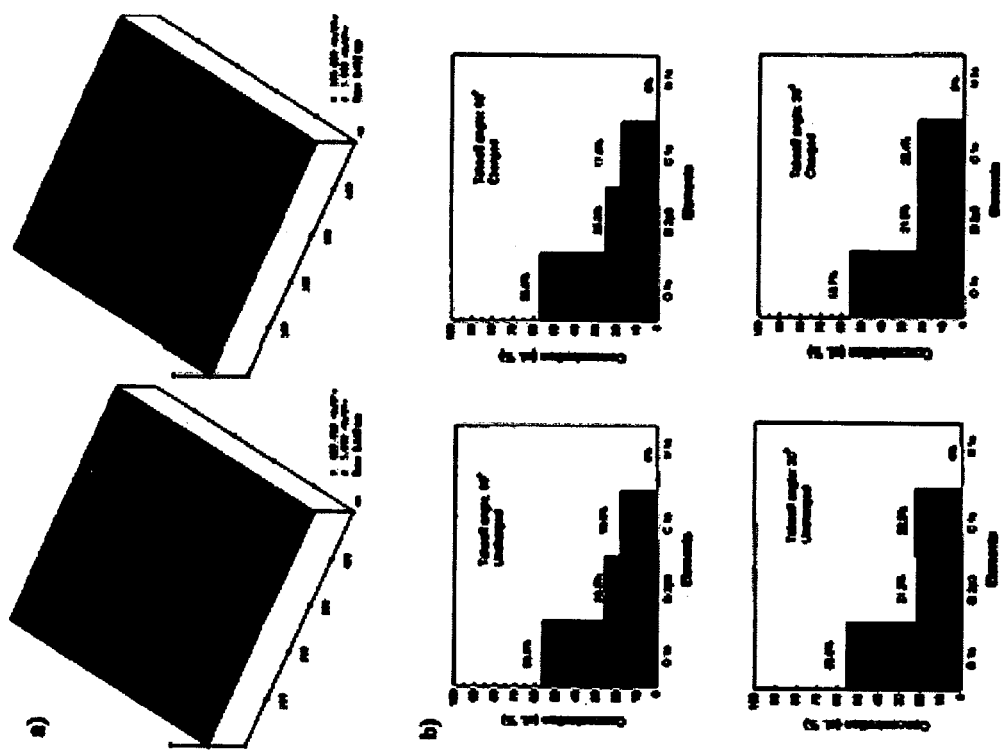
FIG. 8A depicts tapping mode AFM images of the surface morphology of HMDS-coated glass resin. Left: uncharged surface; Right: charged surface with corona charging and subsequently annealing conditions: $V_c$=-8 kV, $V_G$=-50 V, $T_C$=25° C., $t_c$=10 min, $T_A$=100° C., and $t_A$=30 min. All the films have smooth surfaces with a height scale of 5 nm.
FIG. 8B depicts XPS chemical analysis of the near-surface region (takeoff angle 90°) and the surface. (takeoff angle 20°) of the HMDS-coated glass resin before and after corona charging, respectively. Left: uncharged surfaces; Right: charged surfaces with charging and subsequently annealing conditions: $V_c$=-8 kV, $V_G$=-50 V, $T_c$=25° C., $t_c$=10 min, $T_A$=100° C., and $t_A$=30 min.

2.6 Influence of Corona Charging on Chemical and Morphology of Gate Dielectrics and Organic Semiconductors The surface structures and morphology of the gate dielectric are critical to organic transistor performance due to the correlation between morphology and charge transport of OFETs. Therefore we first investigated the influence of corona charging on chemical and morphology of glass resin gate dielectrics. Tapping-mode AFM was used to image the surface morphology of glass resins. FIG. 8A shows the AFM images of the surfaces of glass resin before and after corona charging. It can be seen that almost no morphology change of the glass resin surfaces occurs after corona charging. Moreover, the surface of the glass resin gate dielectric layers is flat on the nanometer scale. The surface roughness of all the films is about 0.5 nm root-mean square (rms). It is also found that the surface quality of the thick films, e.g., 1 pm, is much better than that of the thin films, e.g. 100 nm, for both uncharged and charged glass resin. Furthermore, the surface chemical composition was obtained by X-ray photoelectron spectroscopy (XPS) with different takeoff angles for both uncharged and charged glass resin. Chemical analysis of the surface and the near-surface region by XPS measurements at different takeoff angles is shown in FIG. 8B. The at. % value of each constituent element (except hydrogen) was calculated from the peak heights of the broad scan, taking into account the given elements sensitivity factors. It can also be seen that almost no chemical composition change of the glass resin surfaces occurs after corona charging. Therefore, the glass resin, an inorganic polymer can be exposed to very high electric field stress, resulting in long term exposure to corona charging due to inherent inert silsesquioxane although the treatment of corona charging sometimes is used to modify the surface of polymer-based materials via plasma chemical reaction.

Figure 9:
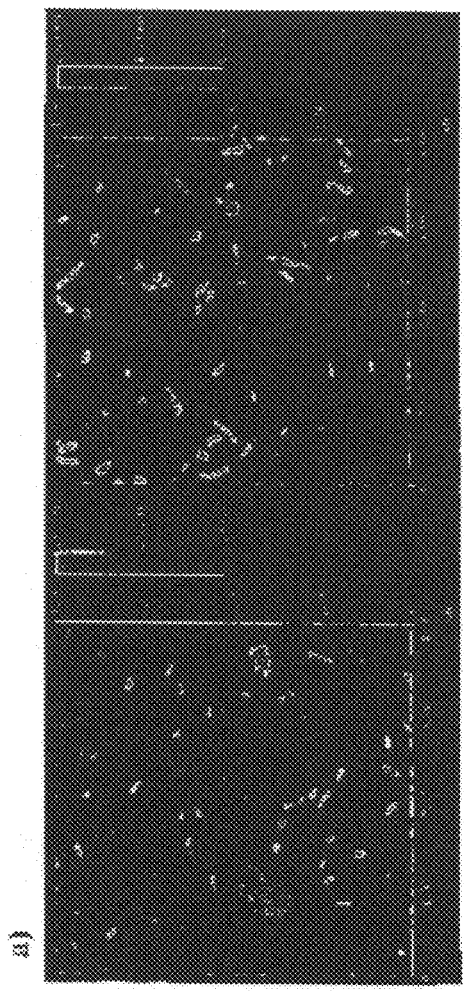
FIG. 9 depicts AFM topographic images of 6PTTP6 films with an average thickness of 30 nm deposited onto surface HMDS-treated glass resin held at room temperature. Left: on uncharged glass resin surface; Right: on charged glass resin surface with charging and subsequently annealing conditions: $V_c$=-8 kV, $V_G$=-50 V, $T_C$=25° C., $t_C$=10 min, $T_A$=100° C., and $t_A$=30 min.
Figure 10:
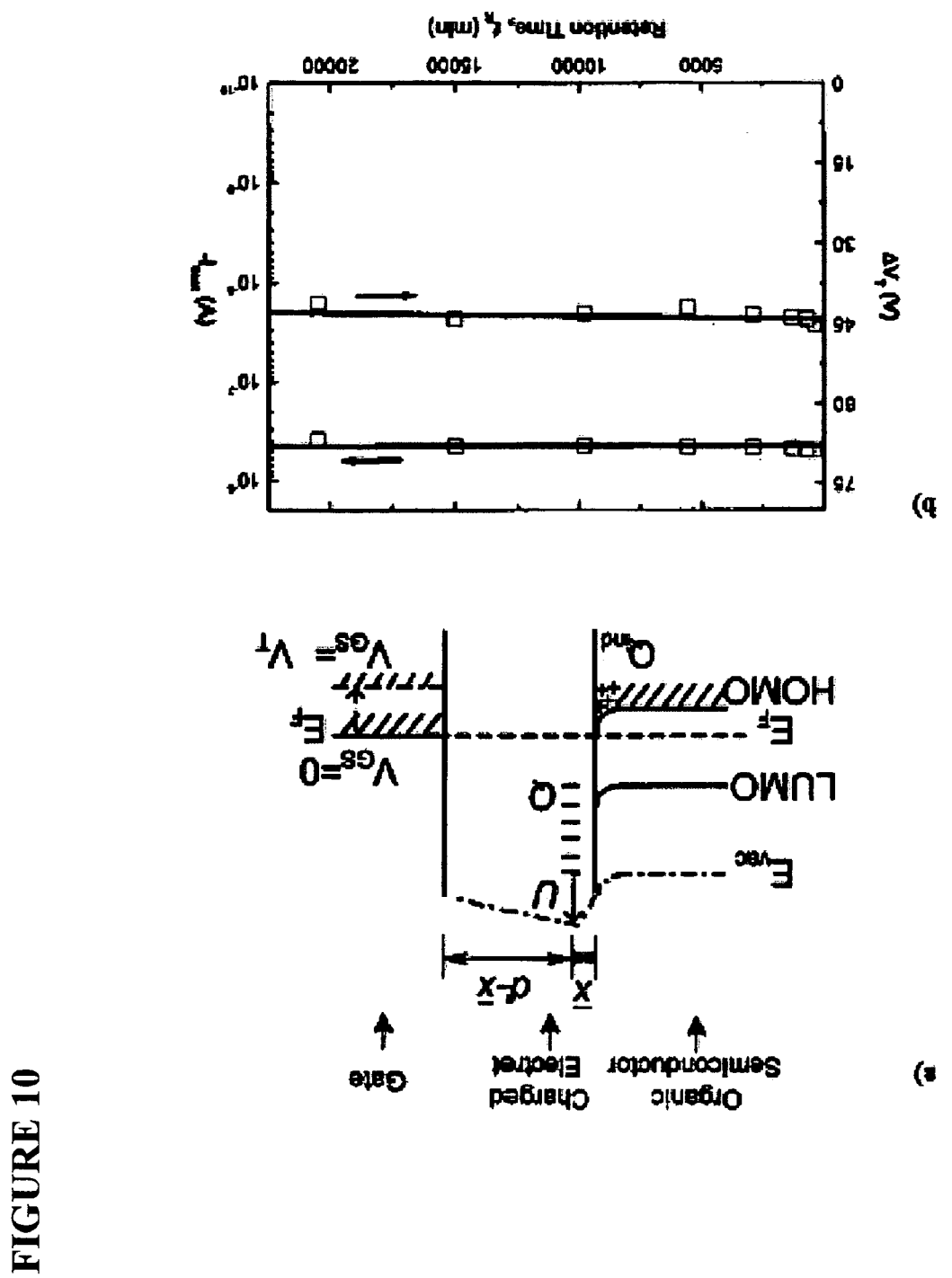
FIG. 10A depicts a schematic energy level diagram suggested for the corona charged OFETs. The negative charges were very stably stored in the bulk of glass resin by controlling the corona charging and subsequently annealing conditions. These trapped negative charges Q electrostatically induce the positive charges $Q_{ind}$ in the p-type OSC transistor channel, which results in the threshold voltage shift $\Delta_{VT}$.
FIG. 10B depicts decay of the threshold voltage shift ($\Delta_{VT}$) and the corresponding drain-source current ($I_{0sat}$) at zero-gate-bias condition, determined from the saturation drain current versus gate voltage transfer characteristics ($V_{DS}$=-60 V), for the 6PTTP6 transistor deposited on HMDS-treated glass resin with the effective surface potential $U_s$=-45 V controlled by the charging and subsequently annealing condition.

Since the surface morphology characterization by AFM and the surface chemical composition analysis by XPS confirmed that chemical and topographical alteration of glass resin, which would probably have increased electron trapping, were negligible, as expected, corona charging did not influence the morphology and structures of OSC when deposited onto the surface of charged glass resins. FIG. 9A shows AFM images of 6PTTP6 OSC grains deposited on uncharged and charged glass resins. Correspondingly, FIG. 10B shows the X-ray diffraction scans from 6PTTP6 films deposited on deposited on uncharged and charged glass resins. These similar results suggest that corona charging did not change the surface morphology and structures of 6PTTP6 layers. The mechanism for charge transport in the OSC thin films are believed to undergo a hopping mechanism at room temperature. Therefore, the morphology of films can greatly affect charge carrier mobilities due to grain boundary effects. In our case, it is found from the experiments that the corona charging does not influence the morphology and structure of glass resin surface, and the unchanged morphology provides nearly constant carrier mobility.

2.7 Charge Storage in Gate Dielectrics and Electrostatic Induction Effects of Charged Electrets To understand the electrostatic charge storage phenomena and charge dynamics inside the glass resin, the charge centroid depth and stored charge density of negatively corona charged glass resin (HMDS-coated) were determined by a combination of electrostatic surface-potential and capacitance voltage (C-II) measurements using the Si substrate as the semiconductor. The mean charge depth x as shown in FIG. 7B and the planar density a of the charge located at the distance x are solved using the glass resin thickness $d_{GR}$, glass resin dielectric constant $\epsilon$, glass resin surface voltage $U_s$, and flatband voltage shift $\Delta V$ of the Si as measurable inputs, with the help of independent simultaneous equations:

$$\bar{x} = \frac{\int_0^{d_{GR}} x\rho(x)dx}{\int_0^{d_{GR}} \rho(x)dx} = \frac{\Delta V d_{GR}}{U_S + \Delta V} \qquad (2)$$

$$\bar{\sigma} = \int_0^{d_{GR}} \rho(x)dx = \frac{\epsilon\epsilon_0(U_S + \Delta V)}{d_{GR}} \qquad (3)$$

where p(x) is the spatial charge density, x is the thickness coordinate with x=0 indicating the initially free glass resin surface, and $d_{GR}$ is the glass resin layer thickness. We have measured the mean charge depth x relative to the initially free glass resin surface as function of annealing temperature (data not shown). The depth increases after annealing at each successive higher temperature, and the curve qualitatively resembles that obtained for a previously measured silicon oxide layer or nitride-oxide bilayer dielectric on Si, except for the deeper trapping of charges in the glass resin electret films. An important result from corona charging and subsequently annealing of glass resin is the generation of very stable negative charges in the bulk of the glass resin. Charge may be clearly stored in the gate dielectric. The annealing process also plays a role in to enhance the charge stability of the electret formed. High temperature annealing can improve the charge storage stability remarkably, because at high temperature there is a fast re-trapping effect in the transportation of detrapped charges. It increases the ratio of charges captured in the deep energy traps to that in shallow energy traps, which causes charges stored to be more stable. In addition, it is possible to shift the charge centroid to a certain position by a controlled annealing step.

The external electric field from a negatively charged electret with one surface bare and one surface metallized will electrostatically induce positive charges on organic semiconductor materials placed nearby. In the present case, these positive charges accumulate in the p-type transistor channel and the transistor exists in the on state under zero gate bias condition. Therefore stored-charge modulated electrical conduction can be obtained with OFETs through a summation effect of stored electrostatic field $E_a$ from "prestored" charges and external electric field $E_{ex}$ from applied gate voltage as illustrated in FIG. 6B. By modulating the effective surface potential $U_s$ and stored charge density $\sigma_s$ of the gate dielectric, the threshold voltage shift and then current can be controlled. As a consequence, the process control of corona charging and subsequently annealing finally influences the threshold voltage shift and current modulation via the effective surface potential. FIG. 10A schematically shows the energy level diagram suggested for the corona charged OFETs. The negative charges were very stably stored in the bulk of the glass resin by controlling the corona charging and subsequent annealing conditions. These trapped negative charges Q electrostatically induce the positive charges $Q_{ind}$ in the p-type OSC transistor channel, which results in the threshold voltage shift $\Delta V_T$. The external positive gate voltage may be applied to cancel out these electrostatically induced positive charges in transistor channel.

To further understand the electrostatic induction phenomena and controllable threshold voltage in OFETs, the field effect is studied in metal-electret-semiconductor (MES) capacitors, which are important for the development of MES devices. Capacitance-voltage curves were measured at room temperature of MES capacitors with 6PTTP6 p type OSC on negatively charged and annealed glass resin with different surface potentials (data not shown). Each surface potential results in a different threshold voltage for observing the contribution of channel charges to the capacitance. In this way the characteristic capacitance-voltage curves can be shifted along the positive voltage axis. With increasingly negative effective surface potentials, the threshold voltages shift to the higher positive gate-voltage, and move outside the +/−40 V range, which indicates that there exist more charge accumulation in the p-type transistor channel at the organic semiconductor-electret interface at zero-gate-bias conditions by electrostatic induction of charged electrets. In particular, the threshold voltage shift and capacitance modulation from MES capacitors are consistent with the threshold voltage and current modulation from the corresponding OFETs.

2.8 OFET Transistor Operation Stability and PMOS-like Unipolar Inverters

The stability of OFETs built on charged electrets was evaluated by the decay of the threshold voltage shift $\Delta V_T$ and the drain-source current ($I_{osat}$) at zero-gate-bias condition, as shown in FIG. 10B. Since the threshold voltage shift of charged OFETs is correlated to the surface potential of the charged electrets, the change in threshold voltage of OFETs on charged electrets can be expressed by the following empirical discharging equation:

$$\Delta V_T \propto \Delta V_{Tmax} \cdot \exp\left(-\frac{t_R}{\tau_R}\right) \cdot \left[1 - \exp\left(-\frac{E_R}{kT_R}\right)\right] \quad (4)$$

where $\Delta V_T$ and $\Delta V_{Tmax}$ correspond to the threshold voltage shift and the maximum of the threshold voltage shift, tR and rR correspond to the time constant and retention time, and $E_R$ and $T_R$ correspond to the activity energy and retention temperature. The third term in Eq. 4 describes the temperature dependence, but since our measurements are made at room temperature, this term is not investigated. The OFET shifts in threshold voltage are described quite well by Eq. 4, and the fits are also shown in FIG. 10B. The time constant $\tau_{RV}$ for the threshold voltage shift $\Delta V_T$ was determined to 10 years, and the corresponding time constant rp for the drain-source current ($I_{osat}$) at zero-gate-bias condition was determined to 12 years. Therefore, one can expect considerable stability of charged OFETs produced by corona charging and annealing. In addition, we found the performance of the OFETs with charged gate dielectric sufficient to allow the construction of simple unipolar inverters and logic gates.

Figure 11:
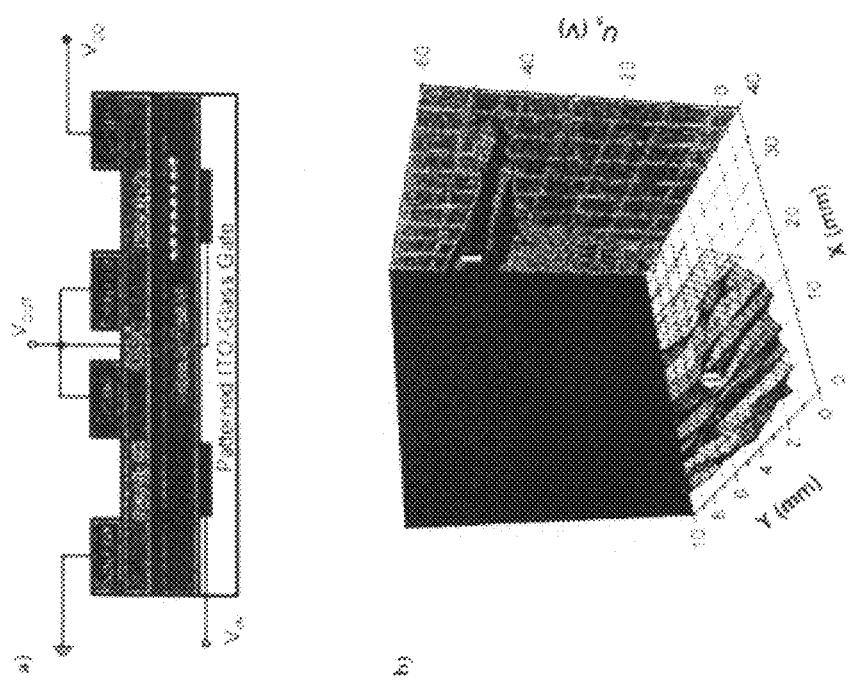
FIG. 11A depicts a schematic configuration of the organic p-channel unipolar inverter on one chip with an enhancement mode transistor driver on the uncharged region of the normal glass resin gate dielectric (the left part) and a depletion mode transistor load on the charged region of glass resin electret (with HMDS coating, the right part), respectively. The channel dimensions for both OFETs were identical.
FIG. 11B depicts effective surface potential profile mapping of patterned negatively charged and annealed glass resin without optimization of spatial resolution. The charging and subsequently annealing conditions for the HMDStreated glass resin are: $V_c$=-8 kV, $V_G$=-50 V, $T_c$=25° C., $t_c$=10 min, $T_A$=100° C., and $t_A$=30 min. The effective surface potential Us significantly increased in charged area "1" with uniform stored-charge distribution compared to non-charged area "0".
Figure 12:
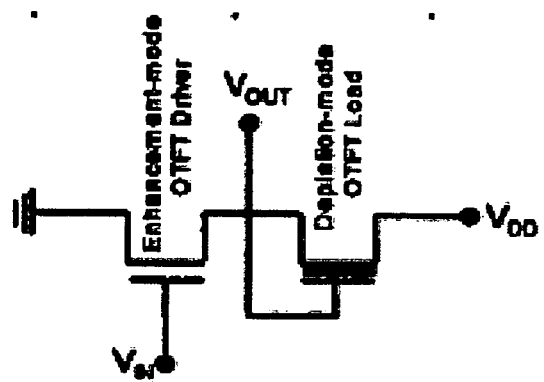
FIG. 12 depicts the electric circuit and layout of the unipolar inverter. $V_{IN}$ is input voltage, $V_{OUT}$ is output voltage, and $V_{DD}$, the supply voltage is -80V.

As shown in FIG. 7B, the device configuration and the electrical characteristics of charged OFET, respectively, the charged p-channel OFETs exhibit positive threshold voltage, which means that they operate as depletion mode OFETs, which are effectively "on" due to underlying stored charge. To illustrate this capability, we built a 6PTTP6 transistor inverter with an enhancement mode OFET driver and a depletion mode OFET load utilizing a charged OFET. FIG. 11A shows the device configuration of a PMOS-like inverter on one chip. In this inverter, the enhancement mode OFET is on the uncharged area of glass resin gate dielectric, and the depletion mode OFET is on the charge area of the glass resin. The channel dimensions for both OFETs were the same in both cases and equal to L=50 µm, W=2 mm. The gates for two OFETs were separated by patterning of the ITO glass. The use of metallic control grid and mask made a uniform and large-area depositing and patterning of charges in glass resin, as shown in FIG. 11B. The 6PTTP6 OSC films were patterned by shown mask to reduce parasitic capacitance and current, thus reducing the off-current, to improve the OFET performance. FIG. 12A shows the load line of the depletion load inverters. By controlling the effective surface potential of glass resin during the corona charging and annealing processes, we can adjust the threshold voltage shift, transistor channel conductivity and source-drain current at zero-gate-bias condition of charged OFETs, and ultimately the unipolar inverter performance (the load lines, voltage transfer characteristics, inverter gains, and noise margin characteristics). Therefore it is not necessary to adjust the transistor channel dimensions to match the current output in order to minimize noise. FIG. 12B shows quasistatic voltage transfer characteristics of a 6PTTP6 p-channel unipolar inverter with the identical channel lengths and widths of the transistors on charged glass resin with appropriate effective surface potential to approximately match the current output. When the drive voltage ($V_{DD}$) and the input voltage ($V_{IN}$) are biased negatively, the inverter works in the third quadrant of the output voltage ($V_{OUT}$) versus $V_{IN}$ plot, exhibiting a maximum voltage gain of 5 and distinct flat levels, nearly full swing characteristic. The fitting data of the output voltage as a function of the input voltage of the inverter (without level shifting), which is determined from FIG. 12A for the corresponding inverter is shown also in FIG. 12B. It is confirmed that, with only two simple OFETs, the minimum output voltage goes down to 0 V and the noise margin is good. These p-type OFET unipolar circuits made up of enhancement mode driver and depletion mode load exhibit full swing, compared to the limited swing from those are made up of all enhancement mode or all depletion mode transistors. We believe that this scheme is an attractive alternative for a simple and reliable OFET logic circuit.

CONCLUSION

In summary, we have demonstrated organic field-effect and unipolar logic gates built on space-charge electrets. The use of polarized gates with stored charges enabled the threshold voltage shift and current modulation of organic semiconductor (OSC) thin films as well as circuit tuning. It is worth noting that the electrostatic induction from charged electrets enables quantitative control of the surface potential, alteration of the carrier concentration, and modulation of the interfacial electronic properties of the OSC layer without introducing any obvious source of lattice or morphological disorder. The unprecedented ability to pattern electrostatic properties prior to semiconductor and electrode deposition and to form full-swing unipolar inverters with constant OFET channel dimensions and from a single organic semiconductor material suggests alternatives for process simplification of electronic components in single-component organic electronics. Materials design improvements in the glass resin itself are accessible through substitution and crosslinking. In addition, the integration of continuous roll-byroll or stamp-by-stamp charging and printing processes of electrical materials would be compatible to large-area and low cost printed circuits and electronics. Nanoscale charging and patterning, which we have demonstrated in preliminary studies, and the ensuing improvement of charge spatial resolution could improve the circuit density in electronic systems.

Example 3

Further Studies on Organic Field-Effect Transistors and Single-Component Complementary Inverters Based on Typical Unipolar n-Channel Copper Hexadecafluorophthalocyanine Semiconductor Thin Films In this Example, we present a detailed study of OFETs that are primarily charged after the deposition of dielectrics, but before the deposition of OSC and the application of the source and drain. The charging process can be monitored using effective surface charge measurements on the dielectrics, and correlated with further observations made on the complete devices. We use a space-charge electret for the preparation of OFETs with a controlled shift of the transfer characteristics. The electrostatic field effect caused by negative charge stored in the gate dielectric induces minority carrier accumulation and trap abating, which results in two phenomena in the OFETs: 1) the threshold voltage shift, and 2) the n- to p-inversion, and results in unipolar inversion mode transistors. The effective surface potential controls the threshold voltage tuning and inversion process.

Figure 13:
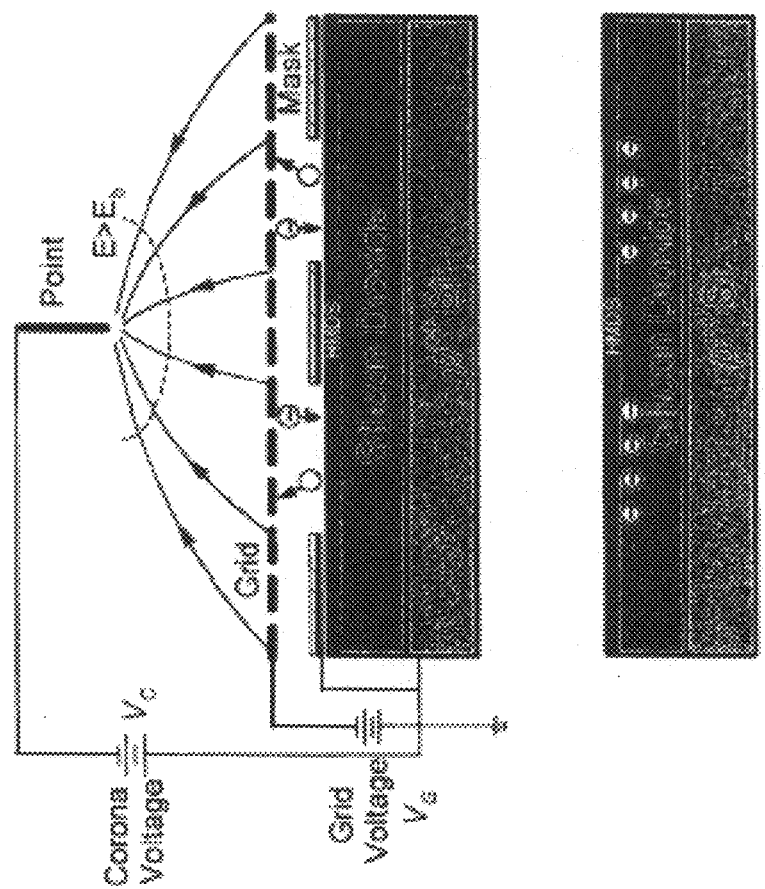
FIG. 13 depicts a schematic of the point-to-grid corona triode apparatus with one metallic control wire grid and mask for uniform and large-area deposition and patterning of charge in thin-film electrets. Curves with arrows represent the distribution of electrostatic field lines in air. The dotted curve represents the breakdown line (E>Eb) in air. Circled minus signs above the silicon dioxide represent the negative ion delivering an electron in air, and circles above the silicon dioxide represent the neutralized molecule which has released the electron. Minus and circled minus represent the electrons and trapped charges, respectively. The charge distribution inside the silicon dioxide is controlled by both the charging and subsequently annealing conditions. $V_C$ is the corona voltage, and $V_G$ is the control grid voltage.

Heavily doped p-type silicon wafers (Si-Tech Inc.) with a 300-nm thick, wet thermally grown silicon dioxide ($SiO_2$) layer (Process Specialties) were selected as sources for electrical charging and charge storage, and were also used as charge-neutral and charged gate dielectric substrates and common gate electrodes for thin-film transistors and subsequent complementary inverters. The wafers were successively cleaned in hot acetone and hot isopropanol in an ultrasonic bath, and finally thoroughly rinsed with deionized water. After a heat treatment at 200° C. for several hours, the oxide surface was exposed to hexamethyldisilazane (HMDS) vapor at 120° C. for 5 hours and then annealed in air at 120° C. for 2 minutes. A hydrophilic-to-hydrophobic conversion of the surface with a trimethylsilyl (TMS) monolayer prior to corona charging makes the injected charges more stable. Silicon oxide electret layers with negative charge storage were prepared with a point-to-grid corona apparatus by varying the charging conditions prior to semiconductor deposition. As shown in FIG. 13, the HMDS-treated wafer was locally and negatively corona-charged through a slit in a grounded circuit board metallized on one side and placed on top of the oxide sample, leaving patterns of charges in the $SiO_2$ film. Here the charging temperature $T_c$ for corona negative charging is room temperature (our experiment indicated that the corona charging of TMS-$SiO_2$ at elevated temperature did not significantly alter the surface potential). The charging time $t_c$ of 10 minutes is sufficient to obtain a homogeneous charge distribution over the sample. The corona voltage $V_c$ and the grid voltage $V_G$ were controlled by a Spellman CZE1000R high voltage supply and a Keithley Model 248 high voltage supply, respectively. After negative corona charging, the charged wafer was annealed with a heat treatment of 30 minutes at 100° C. The thermal annealing procedure was necessary to relocate the charges from surface or shallow traps to more stable volume or deep traps inside the oxide layer, as shown by the charge storage study described below. The effective surface potential $U_S$ of these negative corona charged and subsequently annealed $SiO_2$ layer was measured by a compensation method using a Monroe ISOPROBO non-contacting electrostatic voltmeter (model 244) with a high frequency probe (Model 1017)13. The stored-charge distribution in the $SiO_2$ layer with charge patterning (which was determined by laterally scanning US by moving the sample micropositioner in the x- or y-direction when fixing the Monroe probe. The voltage one needs to compensate the external field $E_a$ corresponds to the surface potential $U_s$, and the effective surface-charge density $\sigma_S$ can now be calculated with the relation:

$$\hat{\sigma}_s = \frac{\varepsilon \varepsilon_0 U_S}{d_{ox}} = C'_{ox} U_S \quad (1)$$

where $\epsilon_o \epsilon_{ox}$ is the dielectric permittivity of $SiO_2$, $d_{ox}$ is the thickness of $SiO_2$ of 300 nm, and $C'_{ox}$ is the measured insulator capacitance per unit area of 10.9 nF cm$^{-2}$. The effective surface potential $U_s$ was controlled by corona charging and subsequently annealing conditions. In our experiment, different levels of effective surface potential and charge storage within the dielectric were studied to observe the relationship between the surface potential of the stored charge and the threshold voltage of transfer curves in regular ntype and inversion operation. Therefore a series of measured effective surface potential $U_S$ of HMDS-treated $SiO_2$ wafers was obtained by adjusting the corona charging and subsequent annealing parameters. When the charging temperature $T_C$, the charging time $t_c$, annealing temperature $T_A$, and annealing time $t_A$ are set as 25° C., 10 min, 100° C., and 30 min, respectively, the measured surface potential $U_s$ are shown here as a function of corona voltages $V_C$ and grid voltage $V_G$, Us (VC, VG) as follows: 0V (0V, 0V); −18V (7 kV, −20V); −42V (−8 kV, −50V); −53V (−8.6 kV, −60V); −80V (−10 kV, −100V); −102V (11 kV, −120V); −151V(−12 kV, −200V); −197V (−12 kV, −250V); −220V (−12 kV, −300V); 276V (−12 kV, −350V); −300V (−12 kV, −400V).

The $F_{16}$CUPc (purchased from Aldrich and purified by sublimation) semiconductor thin films were prepared by vacuum deposition through a shadow mask on chargepatterned $SiO_2$ wafers at a substrate temperature −80° C, under a pressure of 1×10-6 mbar. The evaporation ratio is 0.2-0.4 A/s and the thickness of the resulting film was 25 nm. Finally, the gold source and drain contacts (thickness of 50 nm) were evaporated through a shadow mask, defining a channel length of 50 pm and a width of 2 mm. The complementary inverter was fabricated by evaporating gold source and drain electrodes on both the charged area and non-charged area, both covered by the single $F_{16}$CuPc layer on a substrate.

The electrical characterization of discrete OFETs was performed using an Agilent 4155C semiconductor parameter analyzer with coaxial cables and probes. Quasistatic voltage transfer characteristics of inverters were measured using an Agilent 4155C parameter analyzer with coaxial cables and probes as well as a digital voltmeter. The Agilent I/CV 2.1 Lite automation software controlled the measurements. The dielectric capacitance C' and capacitance-voltage (C-V) curves were measured using an Agilent 4282A precision LCR meter at a frequency of 1 kHz and a level of 0.5 V. The currentvoltage (1-V) characteristic and breakdown of $SiO_2$ dielectric were determined by a Keithley 2410-C high-voltage sourcemeter with Keithley LabTracer 2.0 software. All the electrical measurements were carried out in ambient air (relatively humidity z 22-40%, temperature=18-25° C.).

Figure 14:
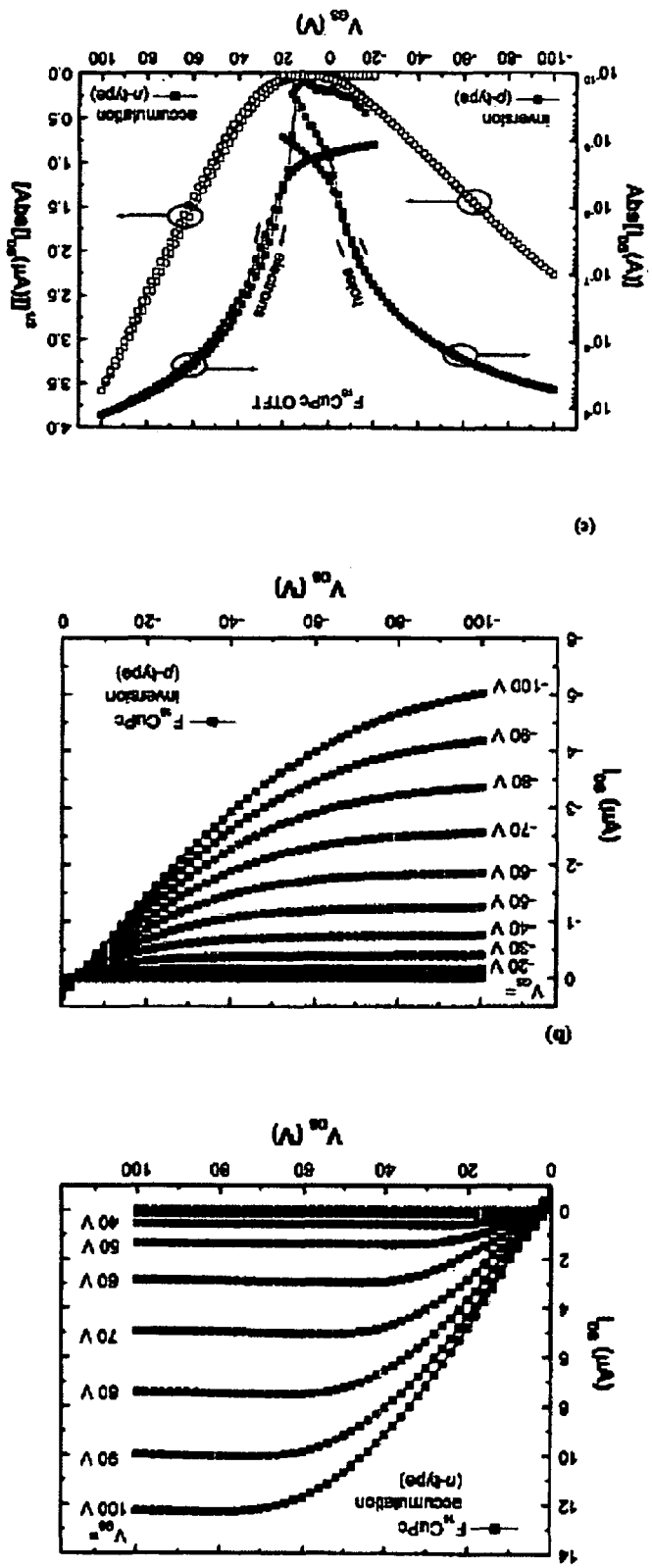
FIG. 14 depicts drain current ($I_{DS}$) versus drain-source voltage ($V_{DS}$) output characteristics measured at room temperature for (A) an $F_{16}$CuPc OFET with normal $SiO_2$ HMDScoated) gate dielectric in accumulation mode (n-type) and (B) an $F_{16}$CuPc OFET with $SiO_2$ charged electret gate in inversion mode (p-type), for utilization in the complementary inverter. $V_{GS}$ is gate voltage. (C) Saturation drain current versus gate voltage transfer characteristics at room temperature of an $F_{16}$CuPc OFET with $SiO_2$ (HMS-coated) gate dielectric in accumulation mode ($V_{DS}$=80 V for n-type, right) and an $F_{16}$CuPC OFET with $SiO_2$ gate charged electret in inversion mode ($V_{DS}$=-80 V for p-type, left), for utilization in the complementary inverter.

As shown in FIG. 14A, typical device characteristics at room temperature of an $F_{16}$CuPc OFET, measured in ambient air, show the device working in typical n-channel unipolar accumulation mode when $F_{16}$CuPc was deposited on the $SiO_2$ uncharged gate insulator area (data not shown). The field-effect electron mobility calculated from the device using the data shown in FIG. 14C is 0.019 $cm^2$ $V^{-1}$ $s^{-1}$ in the saturation region. The on/off current ratio for enhancement-mode-only operation is about $10^5$ measured at a drain-source voltage $V_{DS}$ of 80 V. Typical threshold voltages are in the range of 25V, indicating a large concentration of electron traps. When $F_{16}$CuPc was deposited on the charged area of the $SiO_2$ gate insulator possessing the effective surface potential $U_s$ of −300V (data not shown), the characteristics at room temperature of an $F_{16}$CuPc OFET (as shown in FIG. 14B, measured in ambient air, show the device working in an ordinary p-channel unipolar mode, indicating that a strong n to p inversion occurred. Saturation drain currents similar to normally-p OFETs are observed with field-effect hole mobility of 0.011 cm2 $V^{-1}$ $s^{-1}$ calculated from the data shown in FIG. 14C in the saturation region. An on/off current ratio of about 104 for p-channel operation is measured at V As of −80 V. The threshold voltages are in the range of −10 V for the operation in inversion mode. The inversion is maintained over at least thousands of on/off cycles. Patterning of active areas of OSC reduced the leakage currents and further improved the transistor performance. Both the p- and n-channel $F_{16}$CuPc transistors work exclusively in unipolar mode showing clear saturation, in contrast to most single-component OFETs capable of both p and n operation.

The observed n- to -p inversion in the electrical characteristics and unipolar p-channel operation of $F_{16}$CuPc OFETs cannot simplybe ascribed to chemical doping or a gate-induced direct doping of charges. Negative corona charging would not be expected to directly deliver holes to the dielectric surface. As we know, corona is typically used on organics and especially plastics to create a more hydrophilic surface. It is generally recognized that it does this by nonspecific chemical bond breaking, oxidation and ionization. Therefore the corona process could have impact on the chemistry of the dielectric. In addition, as we mentioned above, a hydrophilic-tohydrophobic conversion of the surface with a trimethylsilyl (TMS) monolayer prior to corona charging is a general method to improve the injected charge storage stability of space-charge inorganic electrets, similar to the report that HMDS treatment of silicon oxide greatly extended the charge storage lifetime. It is very interesting here to detect if there exists a significant hydrophobic-to-hydrophilic recovery of the dielectric surface by corona charging, because a hydrophobic dielectric surface plays two important roles: the enhancement of the carrier transport in transistor channel by abating channel traps and the improvement of charge storage stability in the space-charge electret by reducing surface conductivity.

Figure 15:
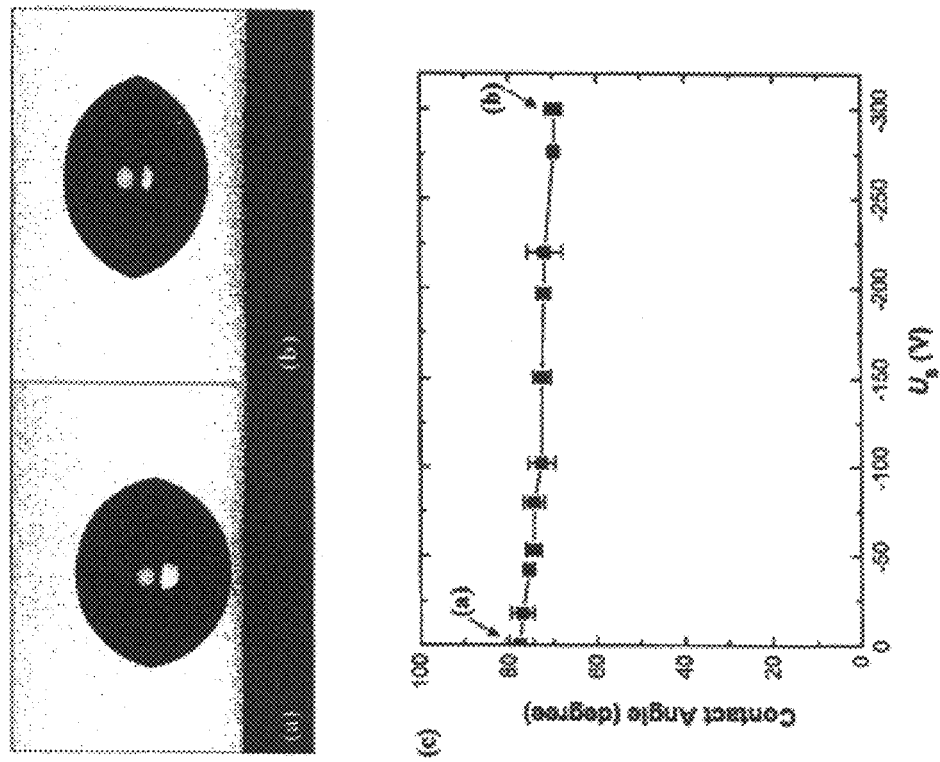
FIG. 15 depicts water droplets on the surfaces of (A) non-charged $SiO_2$ (HMDS-coated) and (B) charged $SiO_2$ (HMDS-coated) with the effective surface potential of -300 V. (C) Contact angle data measured on the surfaces of non-charged and charged $SiO_2$ (HMDS-coated) with different effective surface potential $U_s$. Deionized water was used.

Therefore, surface morphology was characterized by atomic force microscopy [(AFM) NanoScope Ma, Digital Instruments] and surface chemical composition was analyzed by a PHI 5400 X-ray photoelectron spectrometer. In order to investigate possible correlation between trapping behavior and chemical composition of the electret surface and near surface region, X-ray photoelectron spectroscopy W S) was performed at different takeoff angles, which provides this information at different depths below the sample surface: For example, a takeoff angle of 90° corresponds to a typical escape depth of 10 rum, while for a grazing (20°) takeoff angle this value would be 2 run. This allows one to distinguish possible compositional differences between the surface and "bulk" regions of a given sample. The results indicated that chemical and topographical alteration by corona charging, which would probably have increased surface electron trapping, was negligible in our case. However, HMDS forms such a thin trimethylsilyl (TMS) monolayer (~0.5 nm) that it is actually thinner than most adventitious hydrocarbon layers. Corona- and non-corona-treated HMDS surfaces would both show signatures similar to adventitious hydrocarbon in XPS. Therefore the hydrophobic/hydrophilic surface change and corresponding chemical alternation were directly detected by measuring the contact angle of water droplets on HMDS-$SiO_2$ surface before and immediately after corona charging. It was found that that there is no significant difference for contact angles of water with non-charged and charged surface as shown in FIGS. 15A and 15B respectively (observed by Model 100-00 Contact Angle Goniometer). Furthermore FIG. 15C shows that the water contact angle did not diminish dramatically with increased corona voltage. The water contact angle measurements indicated that HMDS decreases surface hydrophilicity from the original contact angle of <10 degrees, but the impact of chemical alternation by corona charging appears small. Low-energy and short-time corona charging produced by our setup as shown in FIG. 13 (the maximum corona voltage is −12 kV with screen voltage of −400 V, and the maximum charging time is 10 min) is not enough to cause a significant hydrophobic-to-hydrophilic recovery of the HMDS-$SiO_2$ surface. In addition, recent investigation shows an inorganic electret having a higher chemical stability under corona compared to the chemical modification of organic/polymeric materials. Although it has been reported that transistors with hydrophobic dielectric surfaces can exhibit dramatically altered threshold characteristics and even inversion behavior as compared to transistors with hydrophilic, bare oxide dielectric surfaces, it is unlikely here to that the inversion process and the threshold voltage shift are correlated with hydrophilic-to-hydrophobic conversion.

Figure 16:
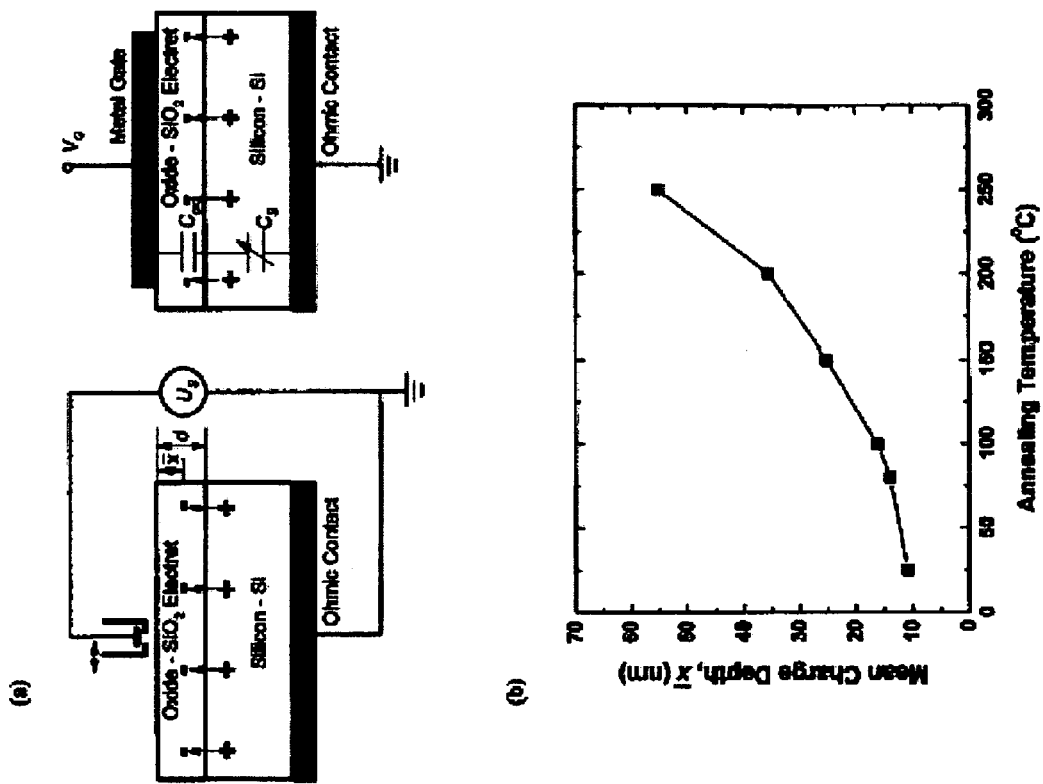
FIG. 16 (A) depicts a schematic of the setup for the measurement of the charge centroid depth and stored charge density of negatively corona charged $TMS-SiO_2$, by a combination of surface-potential and capacitance-voltage (C-V) curve measurements using the Si substrate as the semiconductor. Left: Monroe non-contacting probe for the effective surface measurement of free oxide top surface of negatively charged and annealed HMDS-covered $SiO_2$ samples on n-type Si substrate (Before corona charging, the oxide layer from the rear side of the wafers was removed, and an aluminum electrode was evaporated which served as an Ohmic contact to the substrate.); Right: Subsequent C-V measurement of top-gate metal-electret-semiconductor (MES) capacitor, with free oxide top surface containing an evaporated gold layer as top gate electrode.). (B) Mean charge depth x from the free oxide surface of negatively corona charged oxide samples (with a corona voltage of −12 kV and a controllable grid voltage of −400 V at room temperature) on n-type Si substrate after subsequent annealing for 30 min at each of the temperatures 25, 80,100,150, 200, and 250° C., respectively.

As shown in FIG. 13, for the negative point electrode, only negative ions can reach the dielectric material surface. These ions will donate an electron to the dielectric, and then return to the atmosphere as neutral molecules, leaving a layer of negative trapped electrons just below the oxide surface. These electrons could be realized physically as broken or dangling radicalized bonds in the oxide network. To understand the electrostatic charge storage phenomena and charge dynamics inside the oxide, the charge centroid depth and stored charge density of negatively corona charged TMS-SiO$_2$ were determined by a combination of electrostatic surface-potential and capacitance-voltage (C-I) measurements using the Si substrate as the semiconductor, as shown in FIG. 16A. The mean charge depth x of the electret relative to the initially free surface and the planar density a of the charge located at the distance x are solved using the oxide thickness d$_{ox}$, oxide dielectric constant ϵ, oxide surface voltage U$_S$, and flatband voltage shift ΔV of the Si as measurable inputs, with the help of independent simultaneous equations:

$$\bar{x} = \frac{\int_0^{d_{GR}} x\rho(x)dx}{\int_0^{d_{GR}} \rho(x)dx} = \frac{\Delta V d_{ox}}{U_S + \Delta V} \quad (2)$$

$$\bar{\sigma} = \int_0^{d_{GR}} \rho(x)dx = \frac{\varepsilon\varepsilon_0(U_S + \Delta V)}{d_{ox}} \quad (3)$$

where ρ(x) is the spatial charge density, x is the thickness coordinate with x=0 indicating the initially free oxide surface, and d$_{ox}$ is the oxide layer thickness. FIG. 16B shows the mean charge depth x relative to the initially free oxide surface as function of annealing temperature. The depth increases after annealing at each successive higher temperature, and the curve qualitatively resembles that obtained for a previously measured silicon oxide layer or nitride-oxide bilayer dielectric on Si. An important result from corona charging and subsequently annealing of the oxide layer is the generation of very stable negative charges in the bulk of the SiO$_2$. FIG. 16B indicates a case where charge is clearly stored in the gate dielectric. The annealing process also plays a role in to enhance the charge stability of the electret formed. For example, the mean charge depth of the injected charges by corona charging at room temperature is −10 nm below the surface, similar to the result of direct charging by a contact electrode, while the mean charge depth of the stored charges becomes −16 nm after a heat treatment of 30 minutes at 100° C. High temperature annealing can improve the charge storage stability remarkably, because at high temperature there is a fast re-trapping effect in the transportation of detrapped charges. It increases the ratio of charges captured in the deep energy traps to that in shallow energy traps, which causes charges stored to be more stable. In addition, it is possible to shift the charge centroid to a certain position by a controlled annealing step. It was found that the extrapolated time constant for decay of the charge under ambient conditions from the measured curves of surface potential vs. retention time was on the order of 100 years. Therefore, charges were "prestored" in the dielectric and then retained throughout the whole OFET fabrication and operation processes. This is an unprecedented process sequence, offering new options for the fabrication of complex organic circuits.

The external electric field from a negatively charged electret with one surface bare and one surface metallized will electrostatically induce positive charges on organic semiconductor materials placed nearby. In the present case, these charges fill hole traps and enable additional gate-induced holes to be mobile in the channel. Therefore stored-charge modulated electrical conduction can be obtained with OFETs through a summation effect of stored electrostatic field E$_a$ from "prestored" charges and external electric field E$_{ex}$ from applied gate voltage. The inverted conduction behavior is then to be related to filling of hole trap states by stabilizing an accumulation layer of high positive charge density near the negatively charged gate dielectric surface and is a summation of gate-voltage-induced charge density and high stored-charge-electrostatically-induced charge density in the transistor conducting channel. By modulating the effective surface potential U$_s$ and stored charge density σ$_s$ of the gate dielectric, the majority carrier component which normally dominates the characteristics of the device can be completely and quasipermanently suppressed. As a consequence, the moderate additional negative gate voltages facilitate the operation of an OSC unipolar inversion-mode transistor with only the minority carriers in the conducting channel.

Figure 17:
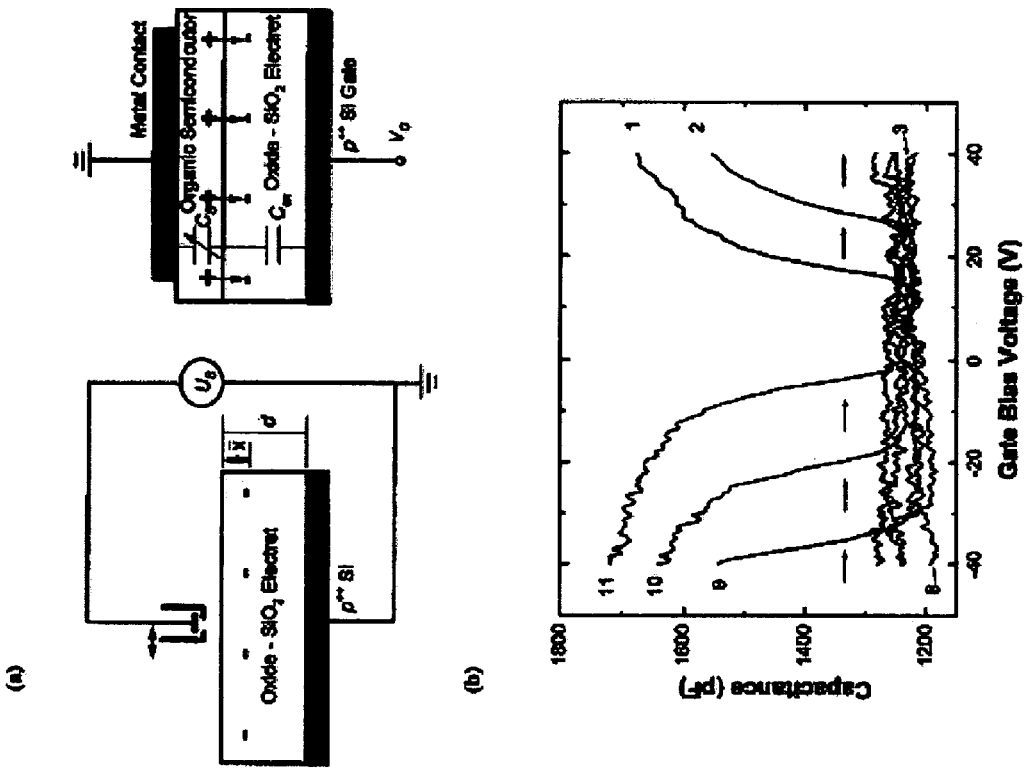
FIG. 17 (A) Left: Monroe non-contacting probe for the top surface potential measurement of negatively charged and annealed TMS-SiO$_2$ on p++ Si substrate; Right: Schematic of the setup for the C-V curve measurement of bottom-gate organic MES capacitors (The OSC layer was evaporated onto the top of the gate electret, and subsequently a gold layer was deposited on the OSC as metal contact.). (B) Capacitance-voltage (C-V) curves and threshold voltage shifts (along the arrow direction) of WS capacitors with F$_{16}$CuPc OSC on negatively charged and annealed SiO$_2$ with different surface potentials: 0 V (label 1), 18 V (label 2), −42 V (label 3), −197 V (label 8), −220 V (label 9), −276 V (label 10), and 300 V (label 11), respectively.

To further understand the electrostatic induction phenomena and inversion control in OFETs, the field effect is studied in metal-electret semiconductor (MES) capacitors (FIG. 17A). FIG. 17B shows capacitance-voltage curves measured at room temperature of MES capacitors with F$_{16}$CuPc OSC on negatively charged and annealed SiO$_2$ with different surface potentials. Each surface potential results in a corresponding threshold voltage for observing the contribution of channel charges to the capacitance. With increasingly negative effective surface potentials, the threshold voltages shift to the higher positive-gate-voltage, move outside the ±40 V range, appear in the negativegate-voltage range, and finally shift to the lower negative-gate-voltage range, which indicates that there exists a gradual conversion from. n-type channel to p-type channel with minority carrier accumulation and inversion layer formation at the organic semiconductor-electret interface. In particular, the threshold voltage shift and capacitance modulation from MES capacitors with non-charged SiO$_2$ and also with −300 V negatively charged and annealed SiO$_2$ are consistent with the threshold voltage and current modulation from the n-channel accumulation mode OFET and p-channel inversion mode OFET, respectively, that are shown in FIG. 14C.

Figure 18:
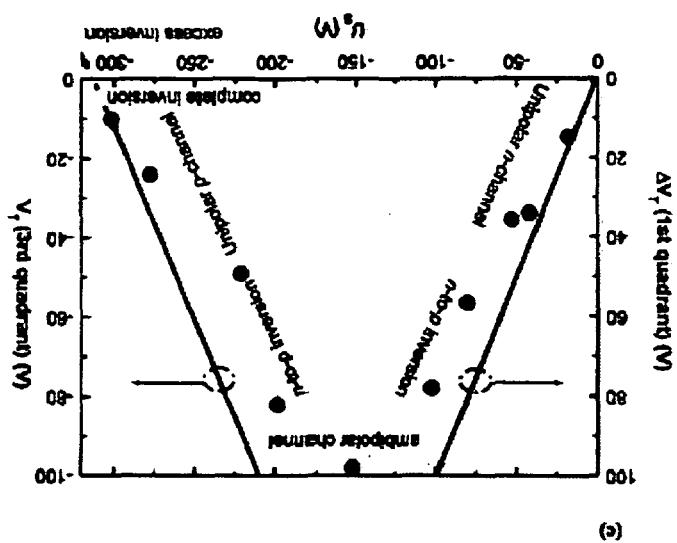
FIG. 18 depicts threshold voltage tuning and gradual n to p-inversion process control from complete drain current (I$_{DS}$) versus gate voltage (V$_{GS}$) transfer characteristics for both positive and negative drain-source and gate voltages in the (A) first or the (B) third quadrant at room temperature for F$_{16}$CUPc OFETs with SiO$_2$ (BNDS-coated) gate dielectrics possessing the corresponding effective surface potential U$_s$ (which is controlled by the charging and subsequent conditions): 0 V (label 1), −18 V (label 2), −42 V (label 3), −53 V (label 4), −80 V (label 5), −102 V (label 6), −151 V (label 7), −197 V (label 8), −220 V (label 9), −276 V (label 10), and −300 V (label 11), respectively. VDS=50 V for the first quadrant and VDS=−50 V for the third quadrant. (C) Effective surface potential Us dependence of threshold voltage shifts (blue dots:. A V T, left) from the first quadrant in FIG. 18A and of threshold voltage (red dots: VT, right) from the third quadrant in FIG. 18B respectively. Arrows schematically indicate the threshold voltage shift and gradual n-to-inversion process control by the effective potential.
Figure 18:
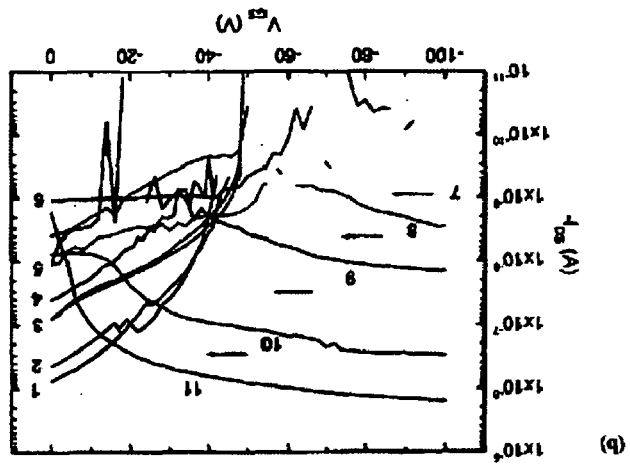
Figure 18:
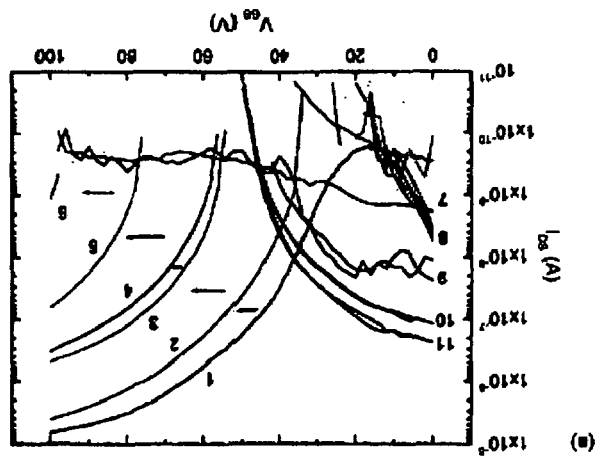

Corresponding to capacitance-voltage curves shown in FIG. 17B, transfer characteristics of the corresponding metal-electret-semiconductor (MES) transistors were measured with different levels of effective surface potential and charge storage within the dielectric. FIGS. 18A and 18B show the threshold voltage shifting of discrete F$_{16}$CuPc transistors with the corresponding effective surface potential U$_s$ of charged SiO$_2$ in the first and third quadrant of the transfer characteristics. Specially, FIG. 18E compared effective surface potential of charged dielectrics with threshold voltage of the transistors fabricated on them. As shown in FIG. 18, by increasing the effective surface potential, in the first quadrant, the threshold voltage moved to high positive voltage and finally disappeared outside the measurement gate range (>100V), and at the same time, with much higher effective surface potential, the threshold voltage surprisingly appeared in the third quadrant within the measurement gate range (>−100V) and moved to lower negative gate voltage with even higher $U_s$. Therefore, FIG. 18 in fact demonstrated all the processes of the gradual conversion of $F_{16}$CuPc transistors from normal-n unipolar characteristics to ambipolar characteristics, and finally to completely unipolar inversion characteristics with the help of charged electrets. Although there exist some traces of ambipolar transport during the transition (transfer characteristics of a transistor showing electron enhancement current at high positive gate bias and hole enhancement current at high negative gate bias), by appropriate electrostatic voltages and with permanent charged electrets, the majority carrier component which normally dominates the characteristics of these devices can be finally completely suppressed all over the $F_{16}$CUPc semiconductor layer, and the accumulation of positive charges in semiconductor thin films results in a complete inversion layer in which mobile charges of the minority carrier type will dominate the characteristics of the devices. As a result, a finally completely inverted $F_{16}$CuPc transistor is electronically equivalent to a normal unipolar p-channel transistor. It is believed that very careful control of the effective surface potential is required to balance the threshold voltage in unipolar inversion-mode transistors; otherwise an excess conversion will occur due to much higher surface potentials.

Furthermore, FIG. 18E indicates that there exists a nearly linear relationship between the surface potential of the stored charge and the threshold voltage of transfer curves in regular n-type and inversion operation. The small difference could be attributed to interface charge trapping during OFET operation or dielectric surface chemistry as discussed above. The result that the threshold voltage shifts OVT of the transistors are significantly close to the effective surface potential $U_s$, means that the "prestored" voltages of charged dielectrics could quantitatively control the threshold voltage shifting. Since the effective surface potential is completely controlled by the corona charging and subsequent annealing conditions above, controlling voltages "prestored" for transistor tuning and final device performance can be realized by finally adjusting the charging conditions of electrets as gate dielectrics. Most important is that these results provide a useful hint of the possibility of using controllable permanent corona charged electrets in order to deplete or invert an organic semiconductor thin film, and finally realizing the control of the threshold voltage for either normal-n or inversionp $F_{16}$CuPc transistors through controllable effective surface potential, instead of a conventional controllable doping and implantation to realize silicon semiconductor device tuning and inversion.

Figure 19:
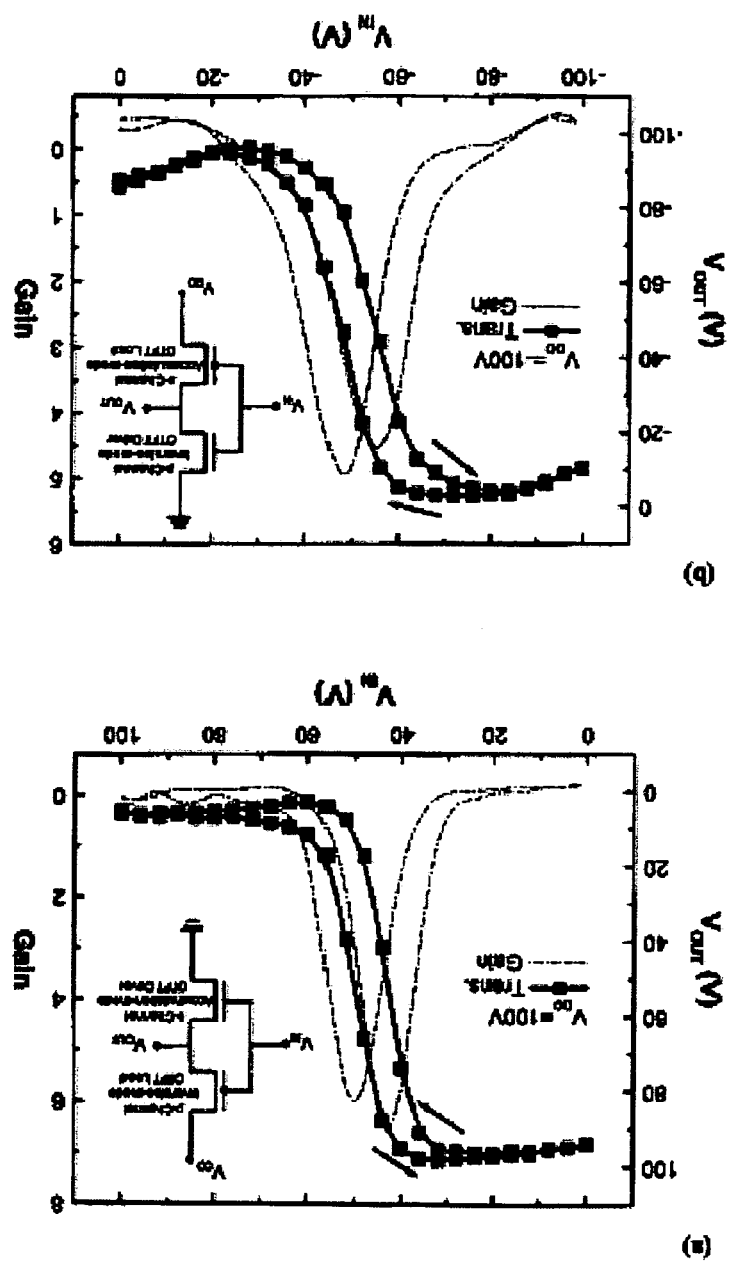
FIG. 19 depicts quasistatic voltage transfer characteristics (solid line) and the corresponding measured gain (dashed line) of the complementary inverter circuits comprised of two transistors on the same chip made from a patterned F$_{16}$CuPc layer as schematically shown in FIG. 13. The channel dimensions for both OFETs were identical and equal to L=50 μm, W=2 mm, and operation frequency f=10 mHz. Depending on the polarity of the supply voltage, V$_{DD}$, and the electrical connections of source and drain electrodes, the inverters work in the first (A) or the third (B) quadrant. Schematic representations of the corresponding inverter circuit configuration and electrical connections in the two inverters are given in the insets. V$_{IN}$ is input voltage, and V$_{OUT}$ is output voltage.
Figure 20:
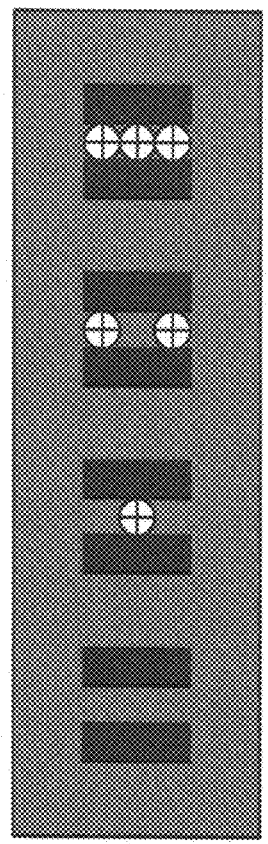
FIG. 20 depicts an array of devices with the same semiconductor but different underlying stored voltages indicated by the plus signs within the series of channels, i.e., source-drain pairs (black rectangles) indicating different degrees of gate voltage "preset" in the gate dielectric underlying each channel.

Charge storage and polarization phenomena in gate dielectrics induced the threshold voltage shift and inversion process control of the same organic semiconductor. Therefore, they can be utilized to fabricate complementary inverters from singlecomponent organic semiconductors for process simplification of organic transistor circuitry. The transfer characteristics of the single-component complementary integrated inverter with an inversion-mode transistor and an enhancement mode transistor from a patterned layer of $F_{16}$CuPc thin film on the same substrate are shown in FIG. 19. In this inverter, the unipolar p-channel inversion transistor is on the charged area of the gate dielectric and the unipolar n-channel enhancement transistor is on the uncharged area of the gate dielectric (data not shown). The channel dimensions for both OFETs were the same in both cases and equal to L=50 μm, W=2 mm. The gates are common for both transistors and serve as the input node (ViN). The insets in FIG. 19 display the schematic of the complementary inverter circuits employed and the electrical connections of the source and drain electrodes. The inversion p-channel $F_{16}$CuPc OFET is used as the load in the first circuit configuration (FIG. 19A) and as the driver in the second configuration (FIG. 19B). When the supply voltage (VDD) and ViN are biased positively (FIG. 19A) the inverter works in the first quadrant of the output voltage ($V_{OUT}$) versus $V_{IN}$ plot, exhibiting a maximum voltage gain of 7. Under these bias conditions the n-channel $F_{16}$CuPc transistor is the driver and the inversion p-channel $F_{16}$CuPc transistor is the load. Inverters with the load and driver reversed were also operational. If the electrical connection of the source and drain electrodes of the inverter is oppositely arranged (FIG. 19B), and the input and the bias voltage are negative, the inverter still operates, this time in the third quadrant of the $V_{OUT}$ versus $V_{IN}$ plot. Under these bias conditions the transistor types are reversed, and the p-channel $F_{16}$CuPc transistor is the driver and the inversion n-channel $F_{16}$CuPc transistor is the load. The maximum gain is −5, lower than that in first quadrant since the n-channel transistor has higher mobility than p-channel transistor. Further improvements are expected from adjusting channel dimensions of both unipolar p- and n-channel transistors, from increasing carrier mobility and electrode modification, and from reducing overlap capacitance. It is worth noting that since unipolar OFET complementary inverters operate only in one quadrant (i.e., either in the first or third), the ability to operate in both quadrants of the $V_{OUT}$ versus $V_{IN}$ plot is a unique feature of these inversion OFET complementary inverters. Means of translating the charging operation to equipment compatible with printed electronics process sequences are under consideration.

We have demonstrated organic field-effect unipolar inversion-mode transistors and complementary logic elements employing a single OSC operable under ambient conditions. The use of a highly charged and annealed gate dielectric enabled p-type field-effect conduction in an OSC that under normal device conditions only exhibits an n-type field effect. Increasing the effective surface potential gradually shifts the threshold voltage and converts the normal n-channel to an inversion p-channel, resulting in a nearly unipolar inversion operation. The charge storage phenomena in the gate dielectric and the electrostatic induction effects caused by stored charges were correlated to the induced charge density in transistor channels which results in the controlled shift of transfer characteristics and the inversion process. It is worth noting that the electrostaticallyassisted "doping" enables quantitative control of the doping level, to alter the carrier concentration, and to modulate the interfacial electronic properties of the OSC layer without introducing any obvious source of lattice or morphological disorder.

The unprecedented ability to pattern electrostatic properties prior to semiconductor and electrode deposition and to form complementary inverters from a single, air-stable material suggests alternatives for process simplification in organic electronics.

REFERENCES

All publications and patents mentioned herein, including those references listed below, are hereby incorporated by reference in their entirety as if each individual publication or patent was specifically and individually incorporated by reference. In case of conflict, the present application, including any definitions herein, will control.

Dodabalapur, A.; Katz, H. E.; Sarpeshkar, R., U.S. Pat. No. 6,870,180

Facchetti, A.; Letizia, J.; Yoon, M.-H.; Mushrush, M.; Katz, H. E.; Marks, T. J., *Chem. Mater.* 16, 4715-4727 (2004)

Mushrush, M.; Facchetti, A.; Lefenfeld, M.; Katz, H. E.; Marks, T. J., *J. Am. Chem. Soc.*, 125, 9414-9423 (2003)

Katz, H. E.; Hong, X. M.; Dodabalapur, A.; Sarpeshkar, R., *J. Appl. Phys.*, 91, 1572-1576 (2002)

EQUIVALENTS

Those skilled in the art will recognize, or be able to ascertain using no more than routine experimentation, many equivalents to the specific embodiments of the invention described herein. While specific embodiments of the subject invention have been discussed, the above specification is illustrative and not restrictive. Many variations of the invention will become apparent to those skilled in the art upon review of this specification. Modifications, for example, to the circuit configuration, dielectric and semiconductor materials, and voltage values, may be made without departing from the spirit and scope of the invention. The full scope of the invention should be determined by reference to the claims, along with their full scope of equivalents, and the specification, along with such variations. Such equivalents are intended to be encompassed by the following claims.

Claimed are:

1. A method, comprising the acts of:
   a. depositing a dielectric layer on a substrate;
   b. locally charging a region of the dielectric layer, thereby forming a charged dielectric layer comprising at least two lateral regions having different charge levels;
   c. depositing a semiconductor material on the surface of the charged dielectric layer, thereby forming a semiconductor layer, such that all or a part of the semiconductor layer is in contact with all or a part of the charged dielectric layer, wherein the semiconductor material is selected from the group consisting of: organic semiconductors, polymeric semiconductors, nanostructured semiconductors, dry transferred semiconductors, and semiconductors that are mixtures of at least two of organic semiconductors, polymeric semiconductors, or nanostructured semiconductors; and the semiconductor layer comprises a first semiconductor region having a first threshold voltage, and a second semiconductor region having a second threshold voltage; and
   d. depositing at least one electrode over at least one of the regions in the dielectric layer.

2. The method of claim 1, wherein the charging is contact charging.

3. The method of claim 1, wherein the act (b) is repeated at least once.

4. The method of claim 1, wherein the charging is corona-charging.

5. The method of claim 1, wherein the charging is performed with a corona voltage with an absolute value of at about 5 kV to about 30 kV, a grid voltage of about −1 kV to about 1 kV, a charging temperature of at least about 20° C. to at least about 200° C., and a charging time of at least about 1 min to at least about 20 min.

6. The method of claim 1, wherein the material comprising the dielectric layer is selected from the group consisting of: inorganic materials, ceramics, polymers, self-assembled films and hybrid materials, and is not a ferroelectric material.

7. The method of claim 1, wherein the material comprising the dielectric layer is silicon dioxide.

8. The method of claim 1, wherein the semiconductor material is an organic semiconductor.

9. The method of claim 8, wherein the difference between the first threshold voltage and the second threshold voltage is at least about ten volts per micron of dielectric thickness into the accumulation regime.

10. The method of claim 1, wherein the material comprising the dielectric layer comprises an additive or has been subjected to a surface treatment to make the material more hydrophobic.

11. The method of claim 1, further comprising (c)' thermally annealing the charged dielectric layer.

12. The method of claim 1, further comprising integrating the at least one electrode into at least one transistor, wherein the transistor has a transistor gate voltage.

13. The method of claim 12, wherein depositing the semiconductor layer on the surface of the charged dielectric layer results in conversion between the p-type and n-type character of one of the semiconductor regions, so that the transistor is an inverted carrier transistor.

14. The method of claim 12, wherein the transistor gate voltage is shifted by at least about five volts per micron of thickness of the dielectric layer.

15. The method of claim 12, further comprising integrating the at least one transistor into one or more of the following: an inverter, an amplifier, a ring oscillator, a rectifier, and a sensor.

16. A method, comprising:
   a. depositing a dielectric layer on a substrate;
   b. charging the dielectric layer to create a charged dielectric layer comprising at least two regions having different charge levels;
   c. depositing a semiconductor layer on the surface of the charged dielectric layer, wherein the semiconductor layer comprises a first semiconductor region having a first threshold voltage, and a second semiconductor region having a second threshold voltage; and
   d. depositing at least two electrodes such that at least one of the electrodes is disposed on the first semiconductor region, and at least one of the other electrodes is disposed on the second semiconductor region.

17. The method of claim 12, further comprising integrating the at least one transistor into a sensor.

18. The method of claim 16, wherein the charging is contact charging.

19. The method of claim 16, wherein the act (b) is repeated at least once.

20. The method of claim 16, wherein the charging is corona-charging.

21. The method of claim 16, wherein the charging is performed with a corona voltage with an absolute value of at about 5 kV to about 30 kV, a grid voltage of about −1 kV to about 1 kV, a charging temperature of at least about 20° C. to at least about 200° C., and a charging time of at least about 1 min to at least about 20 min.

22. The method of claim 16, wherein the dielectric layer comprises inorganic materials, ceramics, polymers, self-assembled films, or hybrid materials.

23. The method of claim 16, wherein the dielectric layer comprises silicon dioxide.

24. The method of claim 16, wherein the semiconductor layer comprises an organic semiconductor, a polymeric semiconductor, a nanostructured semiconductor, or a dry transferred semiconductor.

25. The method of claim 16, wherein the semiconductor layer comprises an organic semiconductor.

26. The method of claim 16, wherein the difference between the first threshold voltage and the second threshold voltage is at least about ten volts per micron of dielectric thickness into the accumulation regime.

27. The method of claim 16, wherein the dielectric layer comprises an additive or has been subjected to a surface treatment to make the material more hydrophobic.

28. The method of claim 16, further comprising the step of: (c) thermally annealing the charged dielectric layer.

29. The method of claim 16, further comprising integrating the at least one electrode into at least one transistor, wherein the transistor has a transistor gate voltage.

30. The method of claim 16, further comprising the step of: attaching a receptor molecule to the first semiconductor region.

31. The method of claim 30, wherein the receptor molecule is covalently attached to the first semiconductor region.

32. A method of chemical sensing, comprising the steps of
   a. exposing an apparatus made according to the method of claim 30 or 31 to a compound of interest.

33. The method of claim 32, wherein the receptor molecule has an affinity for the compound of interest.

34. The method of claim 32, wherein the compound of interest is in the form of a vapor.

* * * * *